United States Patent
Chai et al.

(10) Patent No.: US 8,284,338 B2
(45) Date of Patent: Oct. 9, 2012

(54) DISPLAY DEVICE, METHOD OF MANUFACTURING THE SAME AND MASK FOR MANUFACTURING THE SAME

(75) Inventors: Chong-Chul Chai, Seoul (KR); Shi-Yul Kim, Yongin-si (KR); Sang-Gab Kim, Seoul (KR); Jun-Hyung Souk, Yongin-si (KR); Sang-Woo Whangbo, Seoul (KR); Won-Kie Chang, Seoul (KR); Hi-Kuk Lee, Yongin-si (KR); Soo-Wan Yoon, Seoul (KR); Soo-Jin Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/239,759

(22) Filed: Sep. 22, 2011

(65) Prior Publication Data
US 2012/0009842 A1    Jan. 12, 2012

Related U.S. Application Data

(62) Division of application No. 11/434,487, filed on May 15, 2006, now Pat. No. 8,040,444.

(30) Foreign Application Priority Data

Jun. 3, 2005   (KR) ................................. 2005-47861
Jun. 16, 2005  (KR) ................................. 2005-51910

(51) Int. Cl.
*G02F 1/1343*   (2006.01)
*G02F 1/13*     (2006.01)

(52) U.S. Cl. ............................ 349/38; 349/139; 349/187
(58) Field of Classification Search .............. 349/42–43, 349/149–152, 38, 187; 257/59, 72
See application file for complete search history.

(56) References Cited

U.S. PATENT DOCUMENTS

2003/0218178 A1*  11/2003  Kim ................................ 257/88

FOREIGN PATENT DOCUMENTS

| JP | 2001-324725 | 11/2001 |
| JP | 2002-214641 | 7/2002 |
| JP | 2004-287446 | 10/2004 |
| KR | 1020000056867 | 9/2000 |
| KR | 1020020064021 | 8/2002 |
| KR | 1020030074991 | 9/2003 |

* cited by examiner

*Primary Examiner* — Dung T. Nguyen
(74) *Attorney, Agent, or Firm* — F. Chau & Associates, LLC

(57) ABSTRACT

A mask is provided. The mask includes a mask body, a first exposing part and a second exposing part. The first exposing part is on the mask body. The first exposing part includes a first light transmitting portion and second light transmitting portions. The first light transmitting portion exposes a portion of the photoresist film corresponding to the output terminal to a light of a first light amount. The second light transmitting portions exposes an adjacent portion of the photoresist film adjacent to the output terminal to a light of a second light amount smaller than the first light amount. The second exposing part is on the mask body. The second exposing part includes third light transmitting portions for partially exposing the photoresist film corresponding to the storage electrode to a light of a third light amount that is between the first and second light amounts.

24 Claims, 25 Drawing Sheets

DISPLAY DEVICE, METHOD OF MANUFACTURING THE SAME AND MASK FOR MANUFACTURING THE SAME

CROSS-REFERENCE OF RELATED APPLICATIONS

The present application is a divisional application of co-pending U.S. application Ser. No. 11/434,487, filed on May 15, 2006, which claims priority from Korean Patent Application No. 2005-47861, filed on Jun. 3, 2005, and Korean Patent Application No. 2005-51910, filed on Jun. 16, 2005, the disclosures of which are each hereby incorporated by reference herein in their entireties.

BACKGROUND OF THE INVENTION

1. Field of the Invention

The present invention relates to a display device, and to a method of manufacturing the same. More particularly, the present invention relates to a display device with improved image display quality, a method of manufacturing the display device and a mask for manufacturing the display device.

2. Description of the Related Art

A display device is a device which displays an image based upon an image signal that is processed by an information processing device.

One such example of a display device is a liquid crystal display (LCD) device which displays an image using liquid crystal technology. An LCD device includes an LCD panel and a backlight assembly. The LCD panel controls liquid crystals for displaying an image, and the backlight assembly supplies the LCD panel with light.

The LCD panel includes a thin film transistor substrate, a color filter substrate and a liquid crystal layer. The liquid crystal layer is interposed between the thin film transistor substrate and the color filter substrate.

In addition, the thin film transistor is manufactured using a plurality of masks. The thin film transistor includes a data line, a channel layer, a drain electrode and a storage capacitance electrode. The channel layer is located between the data line and the drain electrode. The storage capacitance electrode forms a storage capacitor that maintains a voltage difference for one frame. However, a difficulty in forming the thin film transistor of an LCD device using conventional manufacturing methods is that semiconductor patterns such as an amorphous silicon patterns and an impurity doped on amorphous silicon patterns may remain under the storage capacitance electrode, which may then ultimately lead to deterioration of the image quality of the LCD device.

For instance, when semiconductor patterns remain underneath the storage capacitance electrode, a parasite capacitance is formed between the storage capacitance electrode, the semiconductor patterns and an opposite storage capacitance electrode. The parasite capacitance forms a flicker on the LCD panel to deteriorate the image display quality of the LCD device.

Thus, there is a need for a display device capable of providing improved image display quality in comparison to conventional display devices and also to methods of forming the same.

SUMMARY OF THE INVENTION

According to an exemplary embodiment of the invention, a mask for patterning a photoresist film covering a signal input unit having an output terminal and a storage electrode is provided. The mask includes a mask body, a first exposing part and a second exposing part. The first exposing part is on the mask body. The first exposing part includes a first light transmitting portion and a plurality of second light transmitting portions. The first light transmitting portion exposes a portion of the photoresist film corresponding to the output terminal to a light of a first light amount. Additionally, the second light transmitting portions exposes an adjacent portion of the photoresist film adjacent to the output terminal to a light of a second light amount that is smaller than the first light amount. The second exposing part is on the mask body, and the second exposing part includes a plurality of third light transmitting portions for exposing a portion of the photoresist film corresponding to the storage electrode to a light of a third light amount that is between the first and second light amounts.

According to another exemplary embodiment of the invention, a mask for patterning a photoresist film covering a signal input unit having an output terminal and a storage electrode is provided. The mask includes a mask body, a slit exposing part and a translucent part. The slit exposing part is on the mask body, and the slit exposing part includes a plurality of slits corresponding to the output terminal. The translucent part is on the mask body for partially removing the photoresist film at a uniform thickness.

According to another exemplary embodiment of the invention, a display device is provided. The display device includes a storage electrode pattern, a dielectric layer, a signal output unit, a dielectric pattern, an insulating pattern and a pixel electrode. The storage electrode pattern is on a substrate. The dielectric layer is on the storage electrode pattern. The signal output unit is on the dielectric layer. The signal output unit includes an output terminal that outputs a data signal based on a timing signal. The dielectric pattern is on the dielectric layer. The dielectric pattern has a first contact hole through which the output terminal is partially exposed. The insulating pattern is on the dielectric layer, the signal output unit and the dielectric pattern. Moreover, the insulating pattern has a second contact hole corresponding to the first contact hole and a third contact hole through which the dielectric pattern corresponding to the storage electrode pattern is partially exposed. The pixel electrode is electrically connected to the output terminal, and the pixel electrode includes a storage electrode portion corresponding to the storage electrode pattern.

According to another exemplary embodiment of the invention, a display device is provided. The display device includes a storage electrode pattern, a signal output unit, a dielectric pattern, an insulating pattern and a pixel electrode. The storage electrode pattern is interposed between a substrate and a dielectric layer on the substrate. The signal output unit is on the dielectric layer, and the signal output unit includes an output terminal that outputs a data signal based on a timing signal. The dielectric pattern is on the dielectric layer. The dielectric pattern has a first contact hole through which the output terminal is partially exposed and a surface increasing part corresponding to the storage electrode pattern. Moreover, the insulating pattern is on the dielectric layer, the signal output unit and the dielectric pattern. The insulating pattern has a second contact hole corresponding to the first contact hole and a third contact hole through which the surface increasing part is partially exposed. The pixel electrode is electrically connected to the output terminal, and the pixel electrode includes a storage electrode portion on the surface increasing part corresponding to the storage electrode pattern.

According to another exemplary embodiment of the invention, a method of manufacturing a display device is provided.

In this method, a storage electrode pattern is formed on a substrate. An output terminal to which an image signal is applied is formed on a first dielectric layer that covers the storage electrode pattern. A second dielectric layer and an insulating layer are formed on the first dielectric layer having the output terminal. The insulating layer and the second dielectric layer are patterned so that a portion of the second dielectric layer corresponding to the output terminal is exposed, and a remaining portion of the insulating layer corresponding to the storage electrode pattern remains on a portion of the second dielectric layer corresponding to the storage electrode pattern. The exposed second dielectric layer and the remaining portion of the insulating layer are partially removed to form a first contact hole through which the output terminal is partially exposed and a second contact hole in the second dielectric layer corresponding to the storage electrode pattern. A pixel electrode is formed on the insulating layer. The pixel electrode is electrically connected to the output terminal through the first contact hole, and corresponds to the storage electrode pattern in the second contact hole.

According to another exemplary embodiment of the invention, a method of manufacturing a display device is provided. In this method, a first signal maintaining portion is formed between a substrate and a first dielectric layer on the substrate. An output terminal is formed on the first dielectric layer. A second dielectric layer and an insulating layer are formed on the first dielectric layer and the output terminal. The insulating layer is patterned to form a first contact hole through which a portion of the second dielectric layer corresponding to the output terminal is partially exposed and a stepped pattern corresponding to the first signal maintaining portion. The second dielectric layer is patterned to form a second contact hole through which the output terminal is partially exposed and an embossed pattern corresponding to the stepped pattern. A pixel electrode electrically connected to the output terminal is formed, and the pixel electrode includes a second signal maintaining portion that covers the embossed pattern.

According to another exemplary embodiment, a method of manufacturing a display device is provided. In this method, a first signal maintaining portion is formed between a substrate and a first dielectric layer on the substrate and an output terminal on the first dielectric layer. A second dielectric layer and an insulating layer are formed on the first dielectric layer and the output terminal. The insulating layer is patterned to form a first contact hole through which a portion of the second dielectric layer corresponding to the output terminal is partially exposed and a plurality of insulating patterns corresponding to the first signal maintaining portion. The insulating patterns have different heights. The second dielectric layer is patterned to form a second contact hole through which the output terminal is partially exposed. The second and first dielectric layers are patterned to form an embossed pattern corresponding to the insulating patterns. A pixel electrode electrically connected to the output terminal is formed, and the pixel electrode includes a second signal maintaining portion that covers the embossed pattern.

According to another exemplary embodiment of the invention, a method of manufacturing a display device is provided. In this method, a storage electrode pattern, a first dielectric layer covering the storage electrode pattern, an output terminal outputting a data signal, a second dielectric layer covering the output terminal and an insulating layer on the second dielectric layer are formed on a substrate. A mask including a slit exposing part having a plurality of slits and a translucent part corresponding to the storage electrode pattern is aligned on the insulating layer. The insulating layer and the second dielectric layer are patterned using the slit exposing part and the translucent part so that a portion of the second dielectric layer corresponding to the output terminal is exposed, and a remaining portion of the insulating layer corresponding to the storage electrode pattern remains on a portion of the second dielectric layer corresponding to the storage electrode pattern. The exposed second dielectric layer and the remaining portion of the insulating layer are partially removed to form a contact hole through which the output terminal is partially exposed and to expose a portion of the second dielectric layer corresponding to the storage electrode pattern. A pixel electrode is formed on the insulating layer. The pixel electrode is electrically connected to the output terminal through the contact hole, and corresponding to the storage electrode pattern in the second contact hole.

BRIEF DESCRIPTION OF THE DRAWINGS

The above and other advantages of the present invention will become more apparent by describing in detail exemplary embodiments thereof with reference to the accompanying drawings, in which.

DESCRIPTION OF THE EXEMPLARY EMBODIMENTS

The invention is described more fully hereinafter with reference to the accompanying drawings, in which exemplary embodiments of the invention are shown. This invention may, however, be embodied in many different forms and should not be construed as limited to the embodiments set forth herein.

Hereinafter, embodiments of the present invention will be described in detail with reference to the accompanying drawings.

Figure 1:
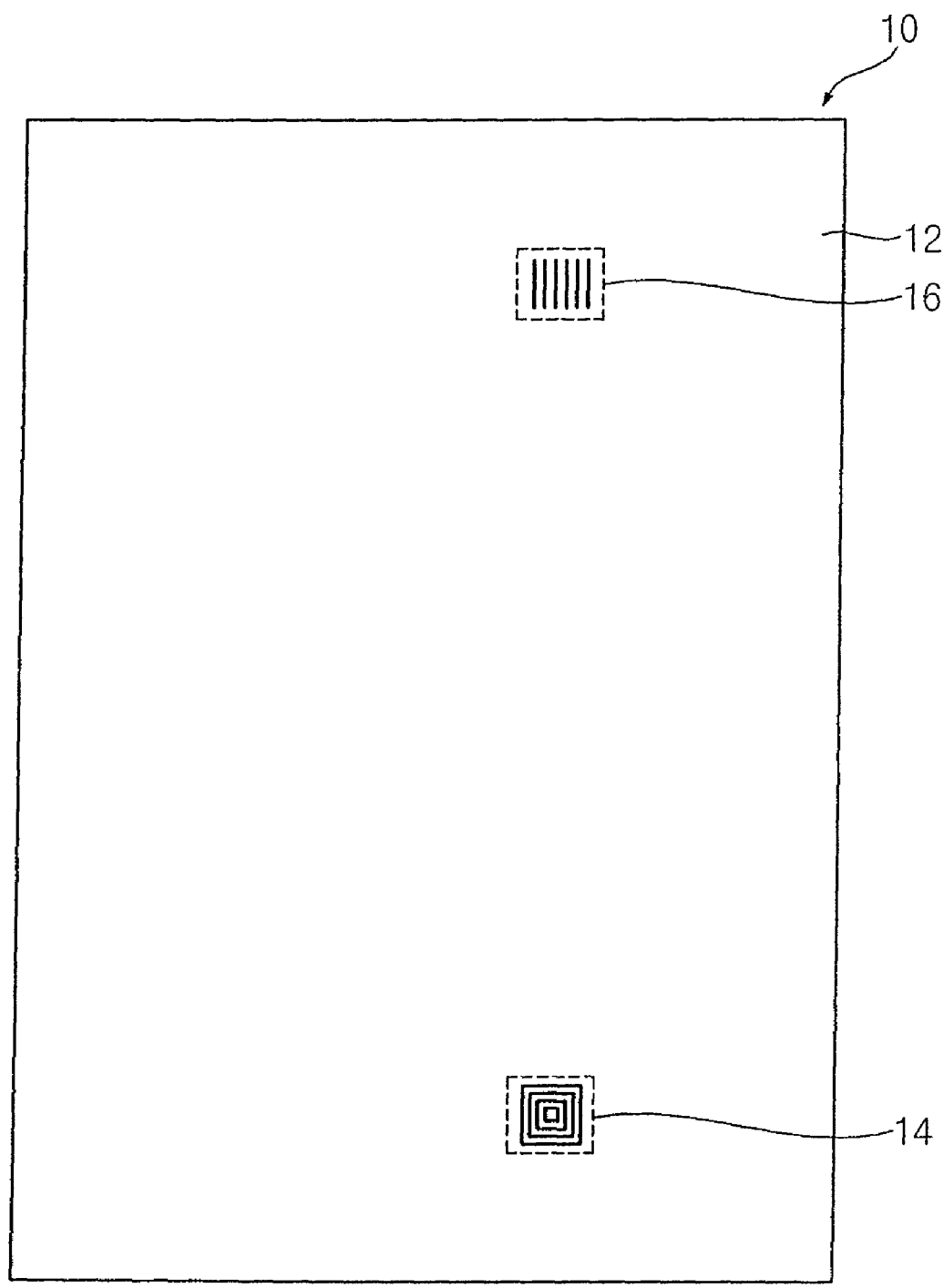
FIG. 1 is a plan view showing a mask in accordance with an exemplary embodiment of the present invention.
Figure 2:
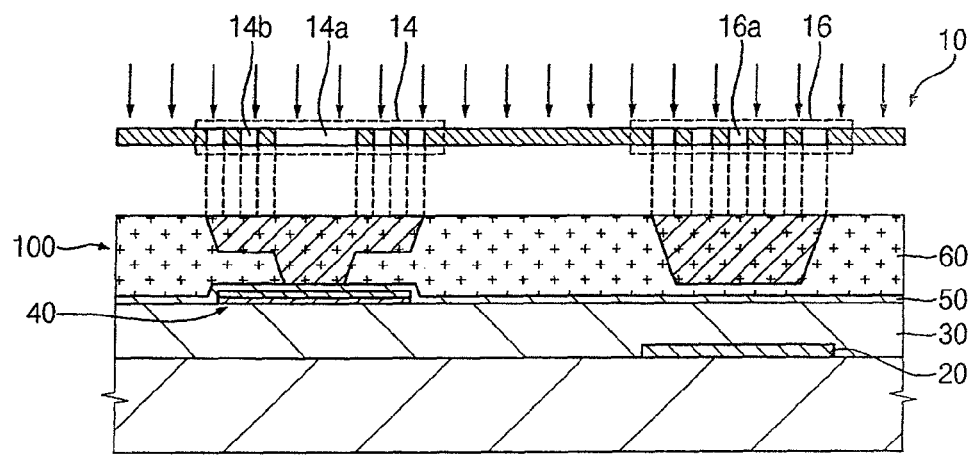
FIG. 2 is a cross-sectional view showing the mask shown in FIG. 1.

FIG. 1 is a plan view showing a mask in accordance with an exemplary embodiment of the present invention. FIG. 2 is a cross-sectional view showing the mask shown in FIG. 1.

The mask may be used, for example, for manufacturing a display substrate having a photoresist film that covers an output terminal of a signal output unit such as a thin film transistor (TFT) and a storage electrode of a storage capacitor that maintains a voltage difference between electrodes during one frame.

Referring to FIGS. 1 and 2, the mask 10 for manufacturing the display device 100 includes a mask body 12, a first exposing part 14 and a second exposing part 16. A light source is on a front side of the mask 10. The light source generates light of a first light amount (or light intensity).

The mask body 12 includes a substrate that blocks the light. The first and second exposing parts 14 and 16 are on the mask body 12. Each of the first and second exposing parts 14 and 16 has a hole so that the light generated from the light source may pass through each of the first and second exposing parts 14 and 16.

Referring to FIG. 2, the first exposing part 14 includes a first light transmitting portion 14a and a second light transmitting portion 14b.

The first light transmitting portion 14a is aligned on an insulating layer 60 corresponding to an output terminal 40. The first light transmitting portion 14a has a substantially quadrangular shape when viewed on a plane. The insulating layer 60 corresponding to the first light transmitting portion 14a is exposed through the first light transmitting portion 14a. For example, the insulating layer 60 corresponding to the first light transmitting portion 14a is fully exposed using light of a first light amount.

The second light transmitting portion 14b is adjacent to the first light transmitting portion 14a, and has a closed slit shape. The second light transmitting portion 14b is substantially the same shape as the first light transmitting portion 14a. For example, the second light transmitting portion 14b may have a substantially quadrangular loop shape with a width of about 1.2 μm to about 1.4 μm. For example, the width may be about 1.3 μm.

Moreover, when a portion of the light passes through the second light transmitting portion 14b it is then diffracted so that this portion of the light having passed through the second light transmitting portion 14b becomes light of a second light amount that is smaller than the first light amount. The insulating layer 60 corresponding to the second light transmitting portion 14b is partially exposed using the portion of the light of the second light amount.

The second exposing part 16 is aligned on the insulating layer 60 corresponding to a storage electrode 20. The second exposing part 16 includes a third light transmitting portion 16a corresponding to the storage electrode 20. The third light transmitting portion 16a includes a plurality of slits arranged substantially parallel with each other. For example, the third light transmitting portion 16a may have a slit shape having a width of about 1.6 μm to about 1.8 μm For example; the width may be about 1.7 μm.

When a portion of the light passes through the third light transmitting portion 16a, it is then diffracted so that this portion of the light having passed through the third light transmitting portion 16a becomes light of a third light amount that is smaller than the first light amount but greater than the second light amount.

In FIGS. 1 and 2, when the insulating layer 60 is exposed through the portion of the light of the third light amount, a remaining portion may be formed on the insulating layer 60. The remaining portion may have substantially the same thickness as a dielectric layer 50 under the insulating layer 60.

Figure 3:
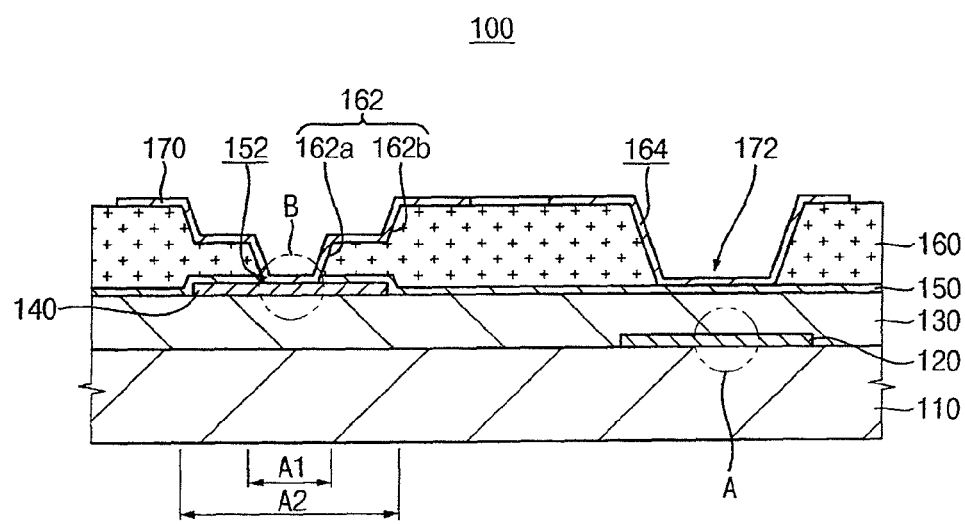
FIG. 3 is a cross-sectional view showing a display device in accordance with an exemplary embodiment of the present invention.

FIG. 3 is a cross-sectional view showing a display device in accordance with an exemplary embodiment of the present invention.

Referring to FIG. 3, the display device 100 includes a substrate 110, a storage electrode pattern 120, a dielectric layer 130, a signal output unit 125 (shown in FIG. 5), a dielectric pattern 150, an insulating pattern 160 and a pixel electrode 170. The storage electrode pattern 120, the dielectric layer 130, the signal output unit 125 (shown in FIG. 5), the dielectric pattern 150, the insulating pattern 160 and the pixel electrode 170 are on the substrate 110. The signal output unit 125 includes an output terminal 140.

The substrate 110 includes a transparent material. Examples of the transparent material that can be used for the substrate 110 include but are not limited to glass or quartz.

The storage electrode pattern 120 is on the substrate 110. A storage capacitor having the storage electrode pattern 120 maintains a voltage difference between the pixel electrode 170 and a common electrode.

Figure 4:
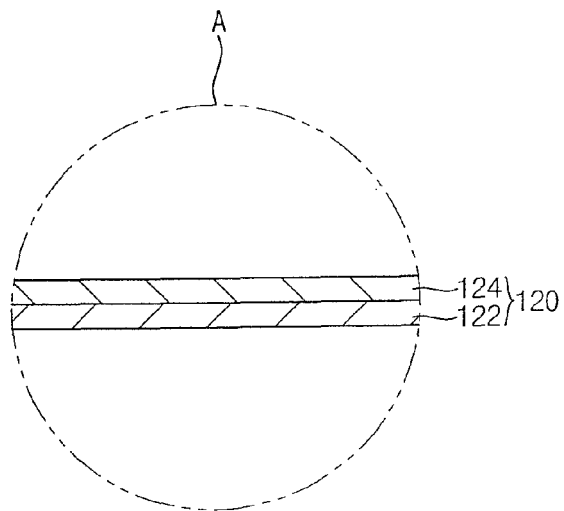
FIG. 4 is an enlarged cross-sectional view showing a portion 'A' shown in FIG. 3.

FIG. 4 is an enlarged cross-sectional view showing a portion 'A' shown in FIG. 3.

Referring to FIG. 4, the storage electrode pattern 120 includes a molybdenum pattern 122 and an aluminum pattern 124. The molybdenum pattern 122 and the aluminum pattern 124 include molybdenum and aluminum, respectively. In this exemplary embodiment, the aluminum pattern 124 is on the molybdenum pattern 122. Alternatively, the storage electrode pattern 120 may include e.g., an aluminum pattern or aluminum alloy pattern.

The dielectric layer 130 is on the storage electrode pattern 120. The storage electrode pattern 120 is electrically insulated from the pixel electrode 170 using the dielectric layer 130. For example, the dielectric layer 130 may be a silicon nitride layer formed through a chemical vapor deposition process.

Figure 5:
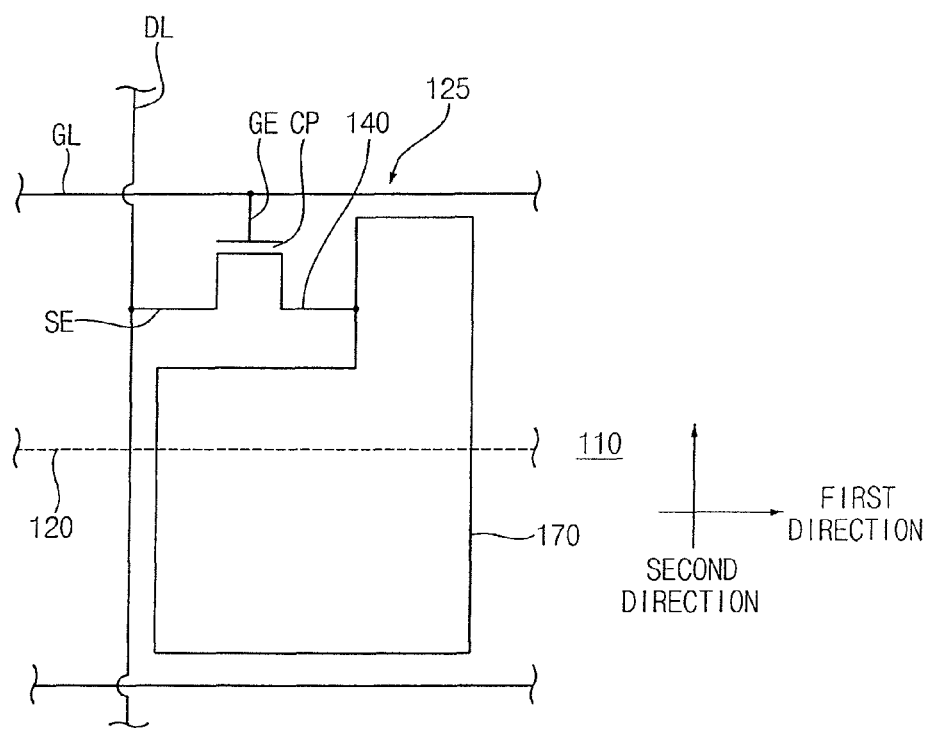
FIG. 5 is a plan view showing a signal output unit including an output pattern shown in FIG. 3.

FIG. 5 is a plan view showing a signal output unit including an output pattern shown in FIG. 3.

Referring to FIG. 5, the signal output unit 125 includes a gate line GL, a data line DL, a channel pattern CP and an output terminal 140. Alternatively, the signal output unit may include a plurality of gate lines, a plurality of data lines, a plurality of channel patterns and a plurality of output terminals.

Referring to FIGS. 3 and 5, the gate lines GL are interposed between the substrate 110 and the dielectric layer 130. The gate lines GL are extended in a first direction. When the resolution of the display device is about 1024×768, the number of the gate lines GL that are arranged in a second direction is about 768. The number of gate electrodes GE electrically connected to each of the gate lines GL may be about 1024×3. Each of the gate electrodes GE is electrically connected to the gate line GL, and protrudes in the second direction.

The gate lines GL may be formed from a layer substantially the same as the storage electrode pattern 120. The gate lines GL may include e.g., a molybdenum pattern and aluminum pattern.

The data lines DL are on the dielectric layer 130, and extend in the second direction. When the resolution of the display device is about 1024×768, the number of the data lines DL is about 1024×3. The number of the source electrodes SE that are electrically connected to each of the data lines DL is about 768. Each of the source electrodes SE is electrically connected to the data lines, and protrudes in the first direction.

Figure 6:
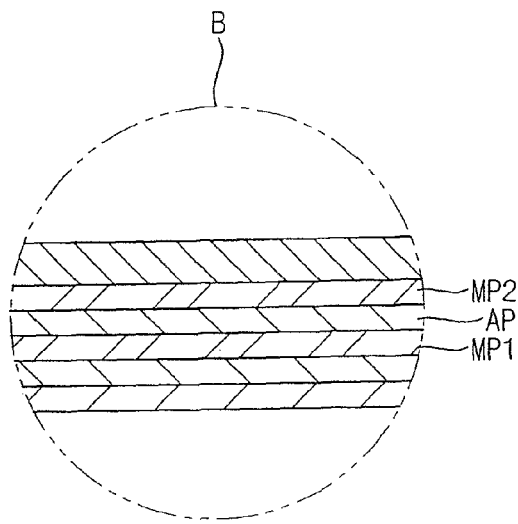
FIG. 6 is an enlarged cross-sectional view showing a portion 'B' shown in FIG. 3.

FIG. 6 is an enlarged cross-sectional view showing a portion 'B' shown in FIG. 3.

Referring to FIG. 6, the data line DL includes a first molybdenum pattern $MP_1$, an aluminum pattern AP and a second molybdenum pattern $MP_2$. For example, the aluminum pattern AP is on the first molybdenum pattern $MP_1$, and the second molybdenum pattern $MP_2$ is on the aluminum pattern AP.

The channel pattern CP is on the dielectric layer 130 corresponding to each of the gate electrodes GE. Each of the source electrodes SE is electrically connected to the channel pattern CP. The channel pattern CP includes an amorphous silicon pattern and an n+ amorphous silicon pattern on the amorphous silicon pattern. Impurities may be implanted (or doped) into the amorphous silicon pattern to form the n+ amorphous silicon pattern.

Referring again to FIGS. 5 and 6, the channel pattern CP may be under the data line DL.

The output terminal 140 is electrically connected to the channel pattern CP. When a timing signal is applied to the gate line GL, an electric channel is formed in the channel pattern CP. A pixel voltage from the data line DL is applied to the output terminal 140 through the channel pattern CP.

Referring again to FIG. 3, the dielectric pattern 150 is on the dielectric layer 130. The dielectric pattern 150 includes silicon nitride. The dielectric pattern 150 includes a first contact hole 152 through which the output terminal 140 is partially exposed. For example, the thickness of the dielectric pattern 150 is about 0.2 μm to about 0.6 μm. For example, the thickness may be about 0.5 μm.

The insulating pattern 160 is on the dielectric pattern 150. The insulating pattern 160 includes a second contact hole 162 and a third contact hole 164.

The second contact hole 162 corresponds to the first contact hole 152 so that the output terminal 150 is partially exposed through the first and second contact holes 152 and 162. For example, the second contact hole 162 includes a first opening 162a and a second opening 162b. The first opening 162a has a first area $A_1$. The second opening 162b has a second area $A_2$ that is smaller than the first area $A_1$. The depth of the second opening 162b may be about half of the thickness of the insulating pattern 160. For example, the thickness of the insulating pattern 160 is about 1.7 μm to about 3.0 μm. The depth of the second opening 162b may be about 1.35 μm to about 1.5 μm.

The third contact hole 164 corresponds to the storage electrode pattern 120. The dielectric pattern 150 corresponding to the storage electrode pattern 120 is partially exposed through the third contact hole 164.

The pixel electrode 170 is on the insulating pattern 160 having the second and third contact holes 162 and 164.

The pixel electrode 170 includes a transparent conductive material. Examples of the transparent conductive material that can be used for the pixel electrode 170 include but are not limited to indium tin oxide (ITO), indium zinc oxide (IZO), or amorphous indium tin oxide (a-ITO), and/or combinations thereof.

The pixel electrode 170 is electrically connected to the output terminal 140 of the signal output unit through the first and second contact holes 152 and 162. Also, the distance between the pixel electrode 170 and the storage electrode pattern 120 is decreased by the third contact hole 164.

In FIG. 3, the third contact hole 164 has a greater width than the storage electrode pattern 120. Alternatively, the third contact hole 164 may have a width no greater than the storage electrode pattern 120. A storage electrode portion 172 is a portion of the pixel electrode 170 corresponding to the storage electrode pattern 120. The storage electrode portion 172 of the pixel electrode 170, the storage electrode pattern 120 corresponding to the storage electrode portion 172 and a portion of the insulating pattern 160 interposed between the storage electrode portion 172 and the storage electrode pattern 120 form a storage electrode to maintain a voltage difference between the pixel electrode 170 and a common electrode during one frame. In addition, the difference between the storage electrode pattern 120 and the storage electrode portion 172 is decreased by the third contact hole 164 to increase the capacitance of the storage capacitor.

Figure 7:
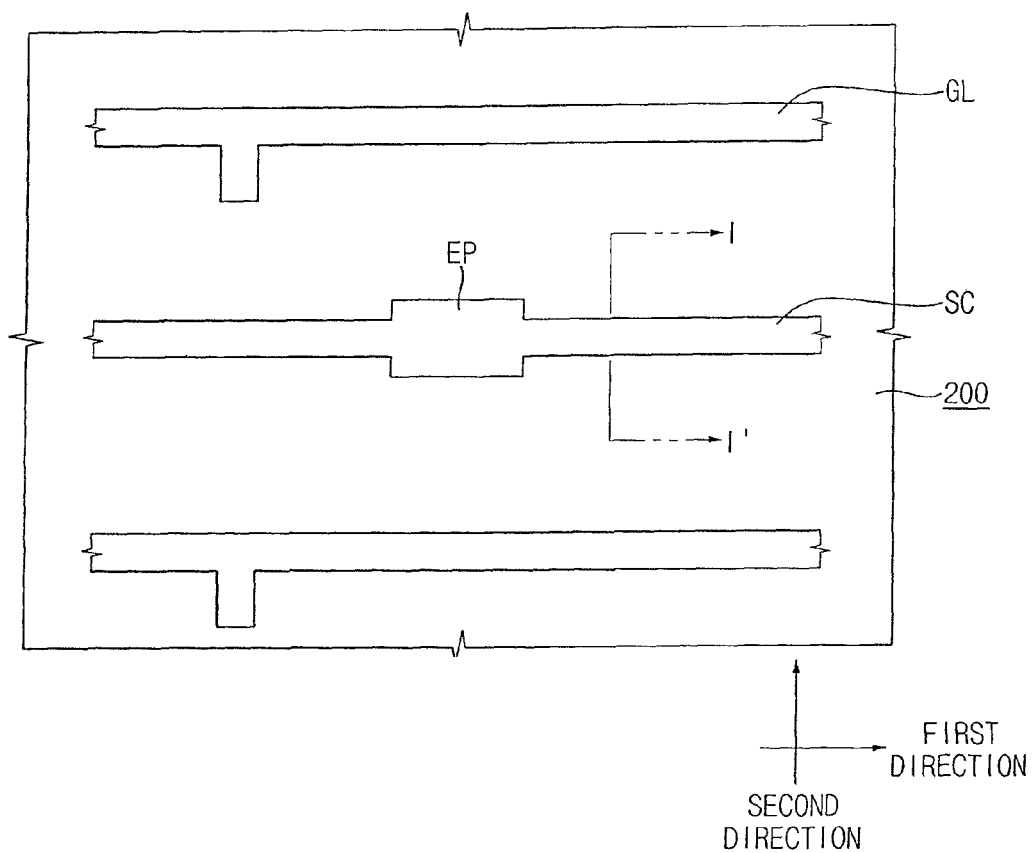
FIG. 7 is a plan view showing a storage electrode pattern on a substrate in accordance with an exemplary embodiment of the present invention.
Figure 8:
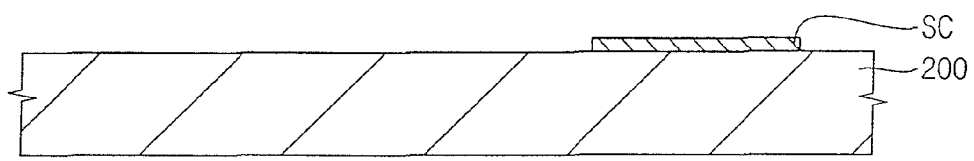
FIG. 8 is a cross-sectional view taken along a line I-I' shown in FIG. 7.

FIG. 7 is a plan view showing a storage electrode pattern on a substrate in accordance with an exemplary embodiment of the present invention. FIG. 8 is a cross-sectional view taken along a line I-I' shown in FIG. 7.

Referring to FIGS. 7 and 8, a metal layer is formed on substantially the entire surface of a substrate 200. The substrate 200 includes a transparent material. Examples of the transparent material that can be used for the substrate 200 include but are not limited to glass or quartz. Examples of a metal that can be used for the metal layer include but are not limited to molybdenum, and/or aluminum. For example, in this exemplary embodiment, the metal layer has a double layered structure including a molybdenum layer on the substrate 200 and an aluminum layer on the molybdenum layer. A photoresist pattern is formed on the metal layer through a photo process and the metal layer is partially etched using the photoresist pattern as an etching mask.

In addition, a storage electrode pattern SC is formed on the substrate 200. A gate line GL and a gate electrode GE may be formed from a layer which is substantially the same as the storage electrode pattern SC. Alternatively, a plurality of gate lines, a plurality of gate electrodes and a plurality of storage electrode patterns may be formed.

When the resolution of the display device is about 1024× 768, the number of the gate lines GL that extend in a first direction is about 768. Further, the storage electrode patterns SC that extend in the first direction may be between adjacent gate lines GL. Each of the storage electrode patterns SC may further include an expanding portion EP that has a greater width than a remaining portion of each of the storage electrode patterns SC for increasing the capacitance of the storage capacitor.

Figure 9:
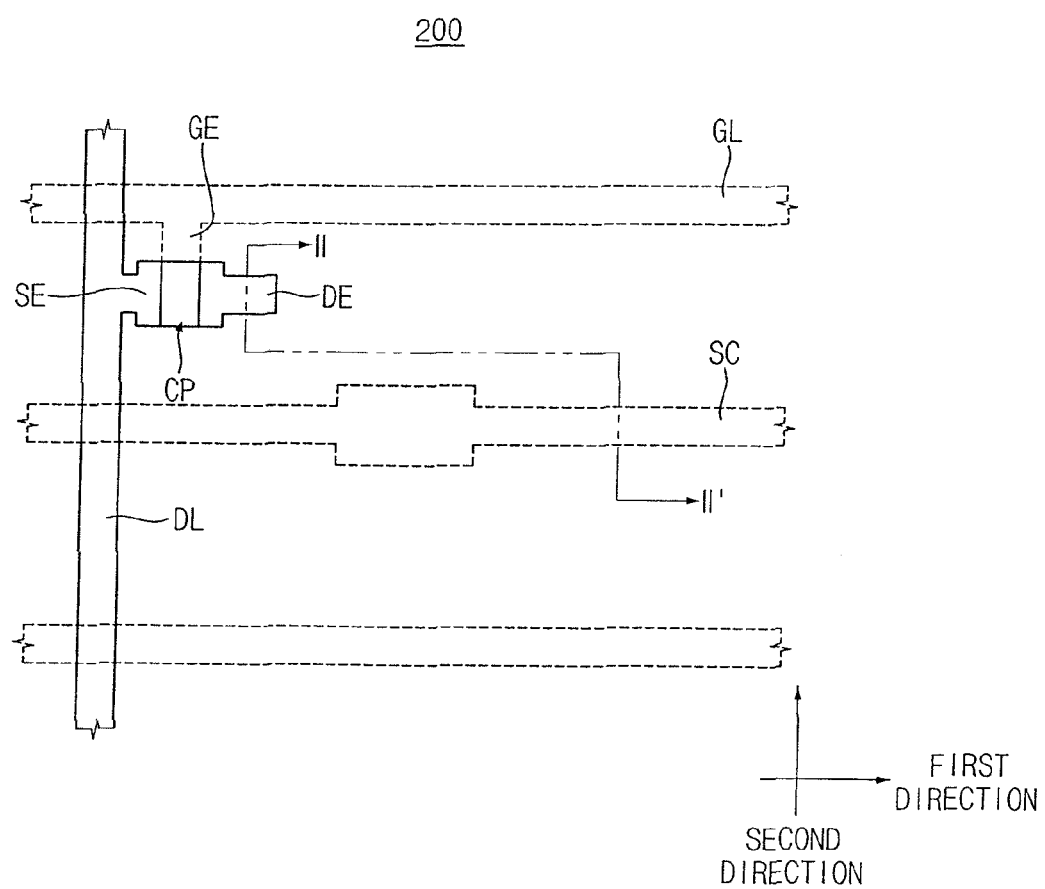
FIG. 9 is a plan view showing an output terminal on a substrate in accordance with an exemplary embodiment of the present invention.
Figure 10:
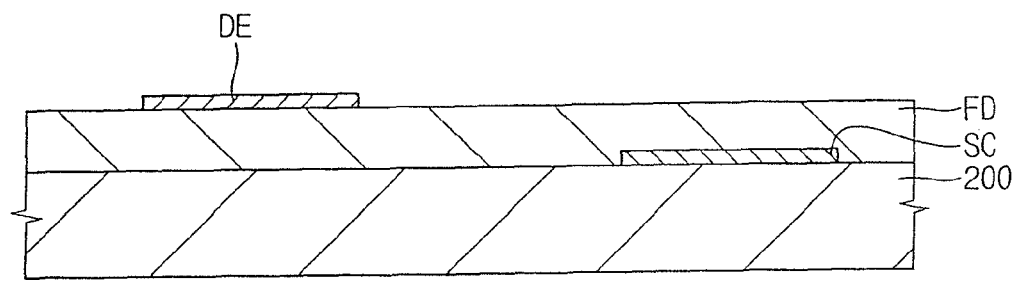
FIG. 10 is a cross-sectional view taken along a line II-II' shown in FIG. 9.

FIG. 9 is a plan view showing an output terminal on a substrate in accordance with an exemplary embodiment of the present invention. FIG. 10 is a cross-sectional view taken along a line II-II' shown in FIG. 9.

Referring to FIGS. 9 and 10, a first dielectric layer FD is formed on substantially the entire surface of the substrate 200 having the storage electrode patterns SC and the gate lines GL. The first dielectric layer FD may be formed through e.g., a spin coating process, or a slit coating process.

A data line DL, an output terminal DE and a channel pattern CP may be formed on the first dielectric layer FD. Alternatively, a plurality of data lines, a plurality of output terminals and a plurality of channel patterns may be formed on the first dielectric layer.

For instance, in this exemplary embodiment, a channel layer having an amorphous silicon layer and an impurity doped silicon layer that is on the amorphous silicon layer is formed on the first dielectric layer FD.

A source/drain metal layer is formed on the impurity doped amorphous silicon layer. The source/drain metal layer includes a first molybdenum thin film, an aluminum thin film that is on the first molybdenum thin film and a second molybdenum thin film that is on the aluminum thin film.

A photoresist film is formed on the source/drain metal layer. The photoresist film is patterned through a photo process to form a photoresist pattern on the source/drain metal layer, and the source/drain metal layer is partially etched using the photoresist pattern as an etching mask to form the data lines DL and the output terminals DE.

When the resolution of the display device is about 1024× 768, the number of the data lines DL is about 1024×3. The data lines DL extend in a second direction that is substantially perpendicular to the first direction. The source electrodes SE are electrically connected to the data lines DL. The source electrodes SE extend in the first direction. A portion of each of the source electrodes SE corresponds to the gate electrode GE. Additionally, each of the output terminals DE is spaced apart from each of the source electrodes SE.

The channel layer is partially etched to form the channel pattern CP using the photoresist pattern, the data lines DL and the output terminals DE. A portion of the impurity doped silicon layer between each of the source electrodes SE and each of the output terminals DE is removed so that each of the source electrodes SE is electrically insulated from each of the output terminals DE.

Figure 11:
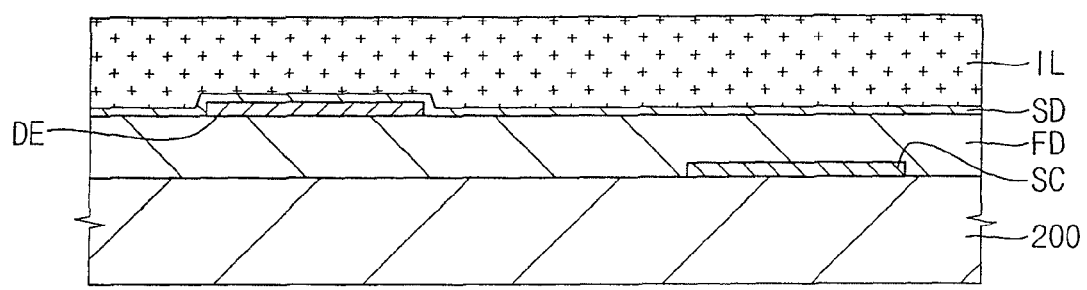
FIG. 11 is a cross-sectional view showing a second dielectric layer and an insulating layer covering the output terminal shown in FIG. 10.

FIG. 11 is a cross-sectional view showing a second dielectric layer and an insulating layer covering the output terminal shown in FIG. 10.

Referring to FIG. 11, a second dielectric layer SD is formed on the first dielectric layer FD. The second dielectric layer SD includes silicon nitride, and covers the output terminals DE that is on the first dielectric layer FD. An insulating layer IL is on the second dielectric layer SD. The insulating layer IL includes a photoresist material.

Figure 12:
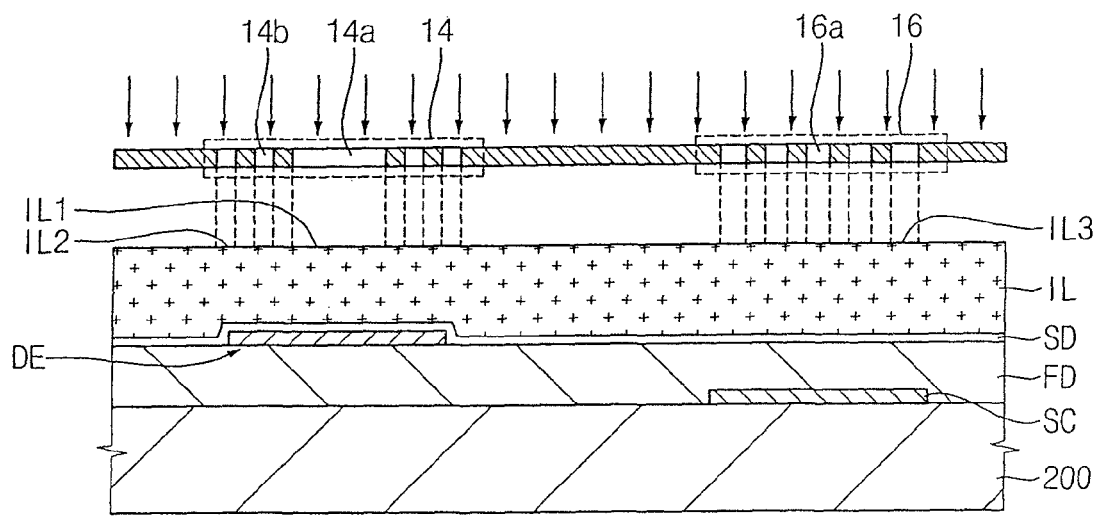
FIG. 12 is a cross-sectional view showing a mask for patterning the insulating layer shown in FIG. 11.

FIG. 12 is a cross-sectional view showing a mask for patterning the insulating layer shown in FIG. 11. The mask of FIG. 12 is the same as in FIGS. 1 and 2. Thus, the same reference numerals will be used to refer to the same or like parts as those described in FIGS. 1 and 2 and any further explanation concerning the above elements will be omitted.

Referring to FIG. 12, the mask 10 having a first exposing part 14 and a second exposing part 16 is aligned on the substrate 200 having the insulating layer IL.

The first exposing part 14 corresponds to the output terminals DE that are under the insulating layer IL. The second exposing part 16 corresponds to the storage electrode patterns SC that are under the first dielectric layer FD.

After the mask 10 is aligned at a predetermined position of the substrate 200, the insulating layer IL including the photoresist material is exposed through the mask 10 having the first and second exposing parts 14 and 16.

The first portion $IL_1$ of the insulating layer IL corresponding to a first light transmitting portion 14a of the first exposing part 14 is exposed to a light of a first light amount. A second portion IL₂ of the insulating layer IL corresponding to a second light transmitting portion 14b of the first exposing part 14 is exposed to a light of a second light amount. The second light amount may be about half of the first light amount. A third portion IL₃ of the insulating layer IL corresponding to a third light transmitting portion 16a of the second exposing part 16 is exposed to a light of a third light amount. The third light amount is smaller than the first light amount, but greater than the second light amount.

Figure 13:
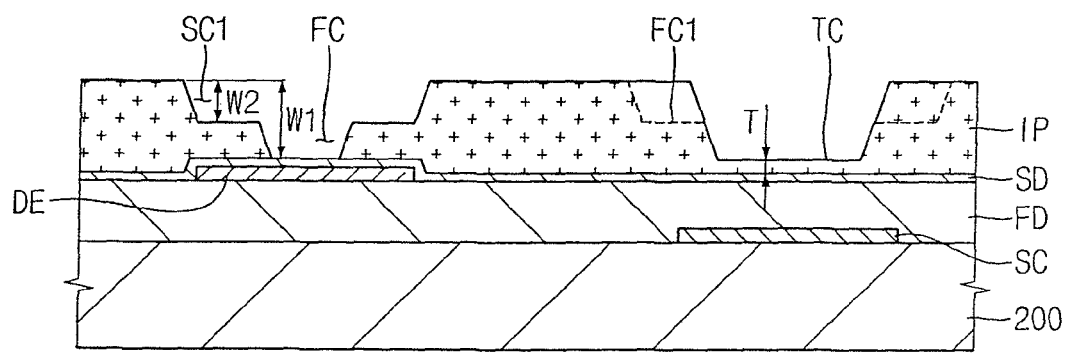
FIG. 13 is a cross-sectional view showing an insulating pattern formed by patterning the insulating layer shown in FIG. 12.

FIG. 13 is a cross-sectional view showing an insulating pattern formed by patterning the insulating layer shown in FIG. 12.

Referring to FIG. 13, the insulating layer IL that is on the second dielectric layer SD is patterned through a photo process to form an insulating pattern IP on the second dielectric layer SD.

For example, in this exemplary embodiment, the first portion IL₁ of the insulating layer IL is fully exposed to the light of the first light amount to form a first opening FC on the insulating layer IL. The second portion IL₂ of the insulating layer IL is partially exposed to the light of the second light amount to form a second opening SC on the insulating layer IL. The third portion IL₃ of the insulating layer IL is partially exposed to the light of the third light amount to form a third opening TC on the insulating layer IL.

The second opening SC has a greater area than the first opening FC when viewed on a plane. A depth W1 of the first opening FC is substantially the same as a thickness of the insulating layer IL. A depth W2 of the second opening SC is about half of the thickness of the insulating layer IL.

A thickness T of a remaining portion remaining in the third opening TC is substantially the same as the thickness of the second dielectric layer SD. The remaining portion blocks the second dielectric layer SD corresponding to the storage electrode patterns SC so that the second dielectric layer SD corresponding to the storage electrode patterns SC may not be etched.

When the second dielectric layer SD corresponding to the storage electrode patterns SC is patterned, the capacitance of the storage capacitor varies so that a flicker, and/or an afterimage may be formed which deteriorates the image display quality. However, as shown in FIG. 13, the remaining portion is in the third opening TC to prevent the above etching of the second dielectric layer SD corresponding to the storage electrode patterns SC.

Alternatively, a fourth opening FC that has substantially the same shape as the second opening SC may be formed adjacent to the third opening TC.

Figure 14:
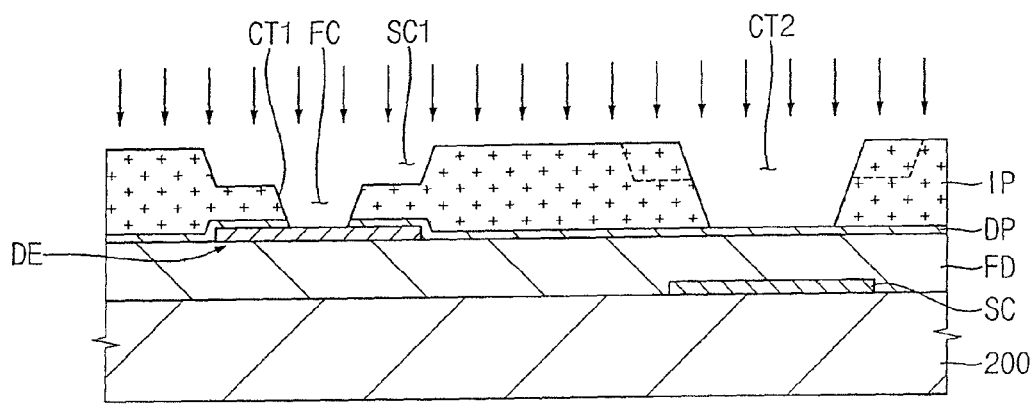
FIG. 14 is a cross-sectional view showing a dielectric pattern formed by patterning the second dielectric layer shown in FIG. 13.

FIG. 14 is a cross-sectional view showing a dielectric pattern formed by patterning the second dielectric layer shown in FIG. 13.

Referring to FIG. 14, the insulating pattern IP and the second dielectric layer SD are etched to form a dielectric pattern DP on the first dielectric layer FD. The insulating pattern IP and the second dielectric layer SD may be etched through a dry etching process or a wet etching process.

A portion of the second dielectric layer SD exposed through the first opening FC corresponding to the output terminal DE is partially removed to form a first contact hole CT₁ in the second dielectric layer SD. The remaining portion on the second dielectric layer SD corresponding to the storage electrode patterns SC is removed through an ashing process using an O₂ plasma to form a second contact hole CT₂ in the insulating pattern IP corresponding to the storage electrode patterns SC.

In FIG. 14, a stepped portion is not formed in the second contact hole CT₂. Alternatively, the stepped portion that has substantially the same cross-section as the first contact hole CT₁ may be formed in the second contact hole CT₂.

Figure 15:
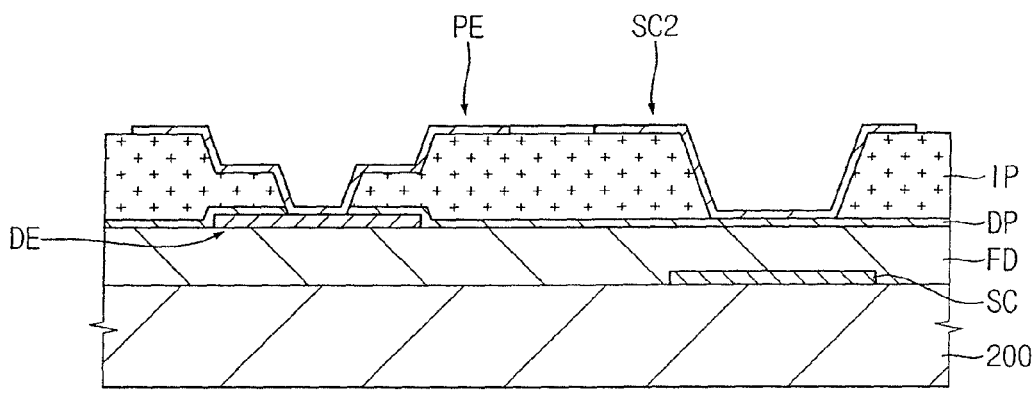
FIG. 15 is a cross-sectional view showing a pixel electrode on the insulating pattern shown in FIG. 14.

FIG. 15 is a cross-sectional view showing a pixel electrode on the insulating pattern shown in FIG. 14.

Referring to FIG. 15, a transparent conductive layer is formed on substantially the whole surface of the insulating pattern IP.

A photoresist film is formed on the transparent conductive layer. The photoresist film on the transparent conductive layer is patterned to form a photoresist pattern.

The transparent conductive layer is etched using the photoresist pattern as an etching mask through e.g., a dry etching process or a wet etching process to form a pixel electrode PE. Alternatively, a plurality of pixel electrodes may be formed on the insulating pattern IP. Each of the pixel electrodes PE is electrically connected to each of the output terminals DE through the first contact hole CT₁. A portion of each of the pixel electrodes PE is on the first dielectric layer FD corresponding to each of the storage electrode patterns SC through the second contact hole CT₂.

The portion of each of the pixel electrodes PE, each of the storage electrode patterns SC, the first dielectric layer FD and the dielectric pattern DP form another storage capacitor.

Figure 16:
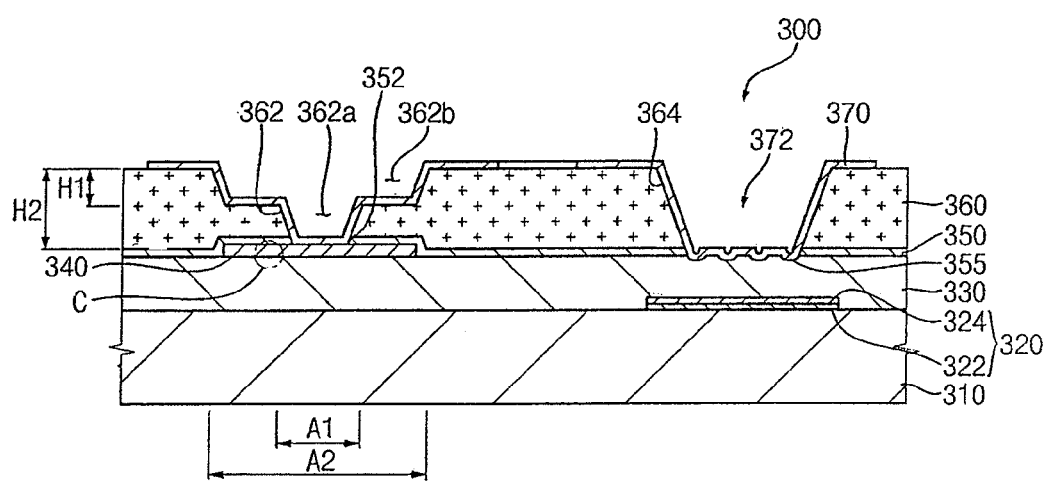
FIG. 16 is a cross-sectional view showing a display device in accordance with an exemplary embodiment of the present invention.

FIG. 16 is a cross-sectional view showing a display device in accordance with an exemplary embodiment of the present invention.

Referring to FIG. 16, the display device 300 includes a substrate 310, a storage electrode pattern 320, a dielectric layer 330, a signal output unit, a dielectric pattern 350, an insulating pattern 360 and a pixel electrode 370. The storage electrode pattern 320, the dielectric layer 330, the signal output unit, the dielectric pattern 350, the insulating pattern 360 and the pixel electrode 370 are on the substrate 310. The signal output unit includes an output terminal 340.

The substrate 310 includes a transparent material. Examples of the transparent material that can be used for the substrate 310 include but are not limited to glass or quartz.

The storage electrode pattern 320 is on the substrate 310. A storage capacitor having the storage electrode pattern 320 maintains a voltage difference between the pixel electrode 370 and a common electrode.

The storage electrode pattern 320 may include a molybdenum pattern 322 and an aluminum pattern 324. The molybdenum pattern 322 and the aluminum pattern 324 include molybdenum and aluminum, respectively. The aluminum pattern 324 is on the molybdenum pattern 322. Alternatively, the storage electrode pattern 320 may include aluminum pattern or aluminum alloy pattern.

The dielectric layer 330 is on the storage electrode pattern 320. The storage electrode pattern 320 is electrically insulated from the pixel electrode 370 using the dielectric layer 330. For example, the dielectric layer 330 may be a silicon nitride layer formed through a chemical vapor deposition process.

Figure 17:
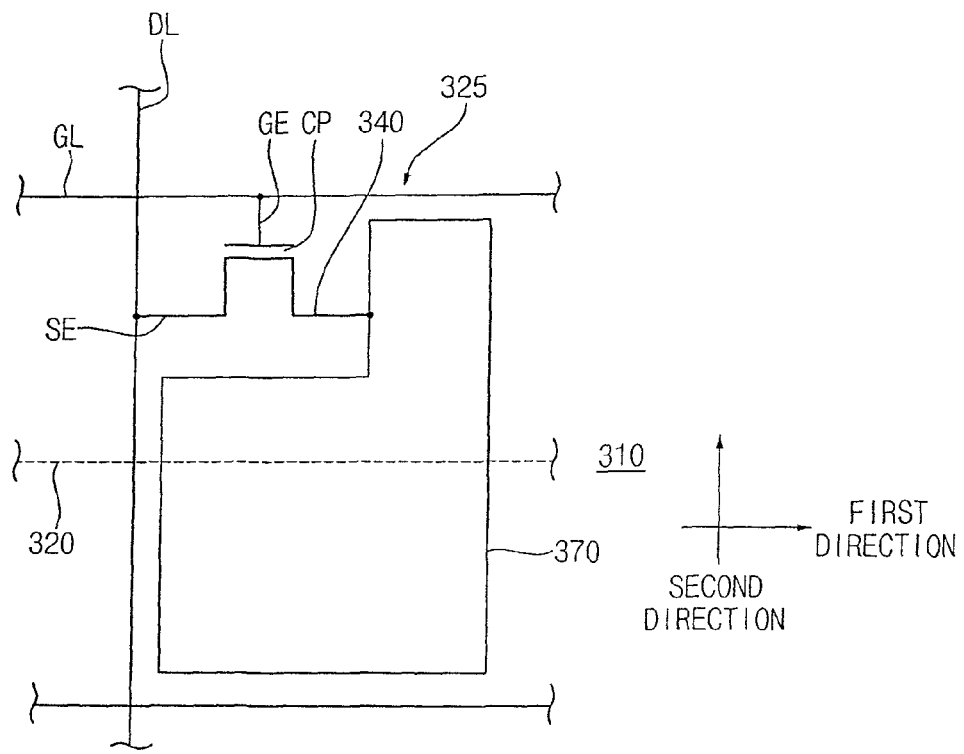
FIG. 17 is a plan view showing a signal output unit having an output pattern shown in FIG. 16.

FIG. 17 is a plan view showing a signal output unit having an output pattern shown in FIG. 16.

Referring to FIG. 17, the signal output unit 325 includes a gate line GL, a data line DL, a channel pattern CP and an output terminal 340. Alternatively, the signal output unit may include a plurality of gate lines, a plurality of data lines, a plurality of channel patterns and a plurality of output terminals.

The gate lines GL are interposed between the substrate 310 and the dielectric layer 330. The gate lines GL extend in a first direction. When the resolution of the display device is about 1024×768, the number of the gate lines GL that are arranged in a second direction is about 768. The second direction is substantially perpendicular to the first direction. The number of gate electrodes GE electrically connected to each of the gate lines GL may be about 1024×3. Each of the gate electrodes GE is electrically connected to the gate line GL, and protrudes in the second direction.

The gate lines GL may be formed from a layer which is substantially the same as the storage electrode patterns 320. The gate lines GL may include e.g., a molybdenum pattern and aluminum pattern.

The data lines DL are on the dielectric layer 330, and extend in the second direction. When the resolution of the display device is about 1024×768, the number of the data lines DL is about 1024×3. The number of the source electrodes SE that are electrically connected to each of the data lines DL is about 768. Each of the source electrodes SE is electrically connected to the data lines, and protrude in the first direction.

Figure 18:
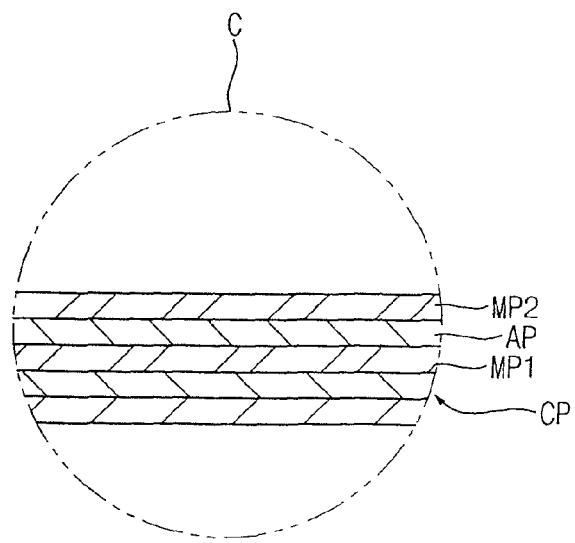
FIG. 18 is an enlarged cross-sectional view showing a portion 'C' shown in FIG. 16.

FIG. 18 is an enlarged cross-sectional view showing a portion 'C' shown in FIG. 16.

Referring to FIG. 18, each of the data lines DL includes a first molybdenum pattern $MP_1$, an aluminum pattern AP and a second molybdenum pattern $MP_2$. For example, the aluminum pattern AP is on the first molybdenum pattern $MP_1$, and the second molybdenum pattern $MP_2$ is on the aluminum pattern AP.

A channel pattern CP is on the dielectric layer 330 corresponding to each of the gate electrodes GE. Each of the source electrodes SE is electrically connected to the channel pattern CP. The channel pattern CP includes an amorphous silicon pattern and an n+ amorphous silicon pattern on the amorphous silicon pattern. Impurities may be implanted on the amorphous silicon pattern to form the n+ amorphous silicon pattern.

An output terminal 340 is electrically connected to the channel pattern CP. When a timing signal is applied to each of the gate lines GL, an electric channel is formed in the channel pattern CP. A pixel voltage that is from the data line DL is applied to the output terminal 340 through the channel pattern CP.

The dielectric pattern 350 is on the dielectric layer 330. The dielectric pattern 350 includes silicon nitride, and the dielectric pattern 350 includes a first contact hole 352 through which the output terminal 340 is partially exposed. For example, the thickness of the dielectric pattern 350 is about 0.2 μm to about 0.6 μm. For example, the thickness may be about 0.5 μm.

Referring again to FIG. 16, the insulating pattern 360 is on the dielectric pattern 350. The insulating pattern 360 includes a second contact hole 362 and a third contact hole 364.

The second contact hole 362 corresponds to the first contact hole 352. The third contact hole 364 corresponds to the storage electrode pattern 320.

For example, the second contact hole 362 includes a first opening 362a and a second opening 362b. The first opening 362a has a first area $A_1$. The second opening 362b has a second area $A_2$ that is smaller than the first area $A_1$. A depth $H_1$ of the second opening 362b may be about a half of a thickness $H_2$ of the insulating pattern 360. For example, the thickness $H_2$ of the insulating pattern 360 is about 1.7 μm to about 3.0 μm. The depth $H_1$ of the second opening 362b may be about 1.35 μm to about 1.5 μm.

The third contact hole 364 corresponds to the storage electrode pattern 320. The dielectric pattern 350 corresponding to the storage electrode pattern 320 is partially exposed through the third contact hole 364.

A surface increasing part 355 is formed on a portion of the dielectric pattern 350 which is exposed through the third contact hole 364.

Figure 19:
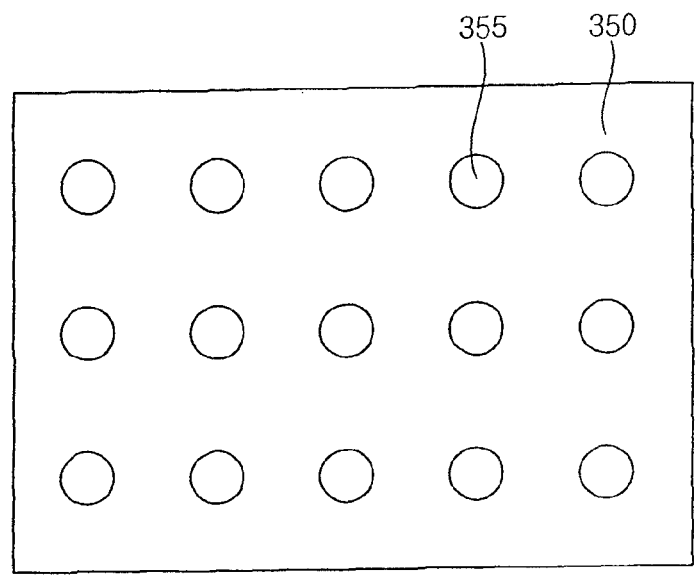
FIG. 19 is a plan view showing a surface increasing part shown in FIG. 16.

FIG. 19 is a plan view showing a surface increasing part shown in FIG. 16.

Referring to FIG. 19, the surface increasing part 355 includes an embossed pattern. The surface increasing part 355 is on the dielectric pattern 350 that is exposed through the third contact hole 364. The surface increasing part 355 increases the surface area of the dielectric pattern 350 to thereby increase the capacitance of the storage capacitor.

For example, the surface increasing part 355 may include a plurality of protrusions that protrude from the surface of the dielectric pattern 350. Alternatively, the surface increasing part 355 may include a plurality of recesses that are recessed from the surface of the dielectric pattern 350. Also, the surface increasing part 355 may include a plurality of convexes and concaves. Further, the surface increasing part 355 may also include a plurality of ridges and grooves.

Figure 20:
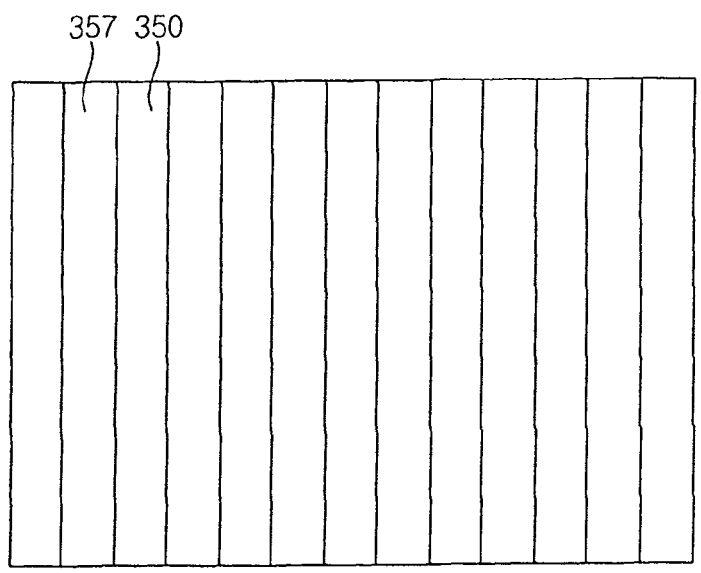
FIG. 20 is a plan view showing a surface increasing part in accordance with an exemplary embodiment of the present invention.

FIG. 20 is a plan view showing a surface increasing part in accordance with another exemplary embodiment of the present invention.

Referring to FIG. 20, a surface increasing part 357 is formed on a portion of the dielectric pattern 350 exposed through the third contact hole 364. The surface increasing part 357 includes a groove. For example, the surface increasing part 357 may include a plurality of grooves that are recessed from a surface of the dielectric pattern 350. Alternatively, the surface increasing part 357 may have a stripe shape or a mesh shape.

The pixel electrode 370 is on the insulating pattern 360 having the second and third contact holes 362 and 364. The pixel electrode 370 includes a transparent conductive material. Examples of the transparent conductive material that can be used for the pixel electrode 370 include but are not limited to indium tin oxide (ITO), indium zinc oxide (IZO), amorphous indium tin oxide (a-ITO), and/or combinations thereof.

The pixel electrode 370 is electrically connected to the output terminal 340 of the signal output unit through the first and second contact holes 352 and 362. The pixel electrode 370 corresponding to the third contact hole 364 is on the surface increasing part 357 corresponding to the storage electrode pattern 320.

In FIG. 16, the third contact hole 364 has a greater width than the storage electrode pattern 320. Alternatively, the third contact hole 364 may have a width which is no greater than a width of the storage electrode pattern 320.

A storage electrode portion 372 is a portion of the pixel electrode 370 corresponding to the storage electrode pattern 320.

Figure 21:
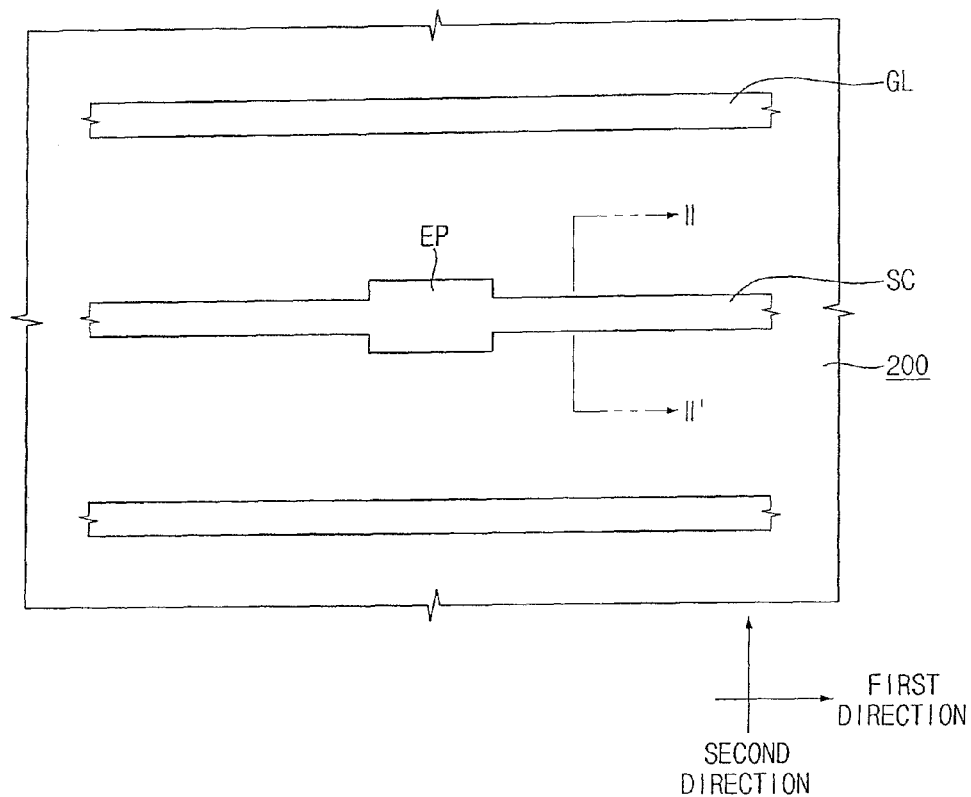
FIG. 21 is a plan view showing a storage electrode pattern on a substrate in accordance with an exemplary embodiment of the present invention.
Figure 22:
FIG. 22 is a cross-sectional view taken along a line III-III' shown in FIG. 21.

FIG. 21 is a plan view showing a storage electrode pattern on a substrate in accordance with an exemplary embodiment of the present invention. FIG. 22 is a cross-sectional view taken along a line III-III' shown in FIG. 21.

Referring to FIGS. 21 and 22, a metal layer is formed on substantially the entire surface of a substrate 400. The substrate 400 includes a transparent material. Examples of the transparent material that can be used for the substrate 400 include but are not limited to glass or quartz. Examples of a metal that can be used for the metal layer include but are not limited to molybdenum, and/or aluminum. For example, the metal layer has a double layered structure including a molybdenum layer on the substrate 400 and an aluminum layer on the molybdenum layer. A photoresist pattern is formed on the metal layer through a photo process, and the metal layer is partially etched using the photoresist pattern as an etching mask.

In addition, a storage electrode pattern SC is formed on the substrate 400. A gate line GL and a gate electrode GE may be formed from a layer which is substantially the same as the storage electrode pattern SC. Alternatively, a plurality of gate lines, a plurality of gate electrodes and a plurality of storage electrode patterns may be formed.

When the resolution of the display device is about 1024× 768, the number of the gate lines GL that extend in a first direction is about 768. The storage electrode patterns SC that extend in the first direction may be between adjacent gate lines GL. Each of the storage electrode patterns SC may further include an expanding portion EP that has a greater width than the remaining portion of each of the storage electrode patterns SC for increasing the capacitance of the storage capacitor.

Figure 23:
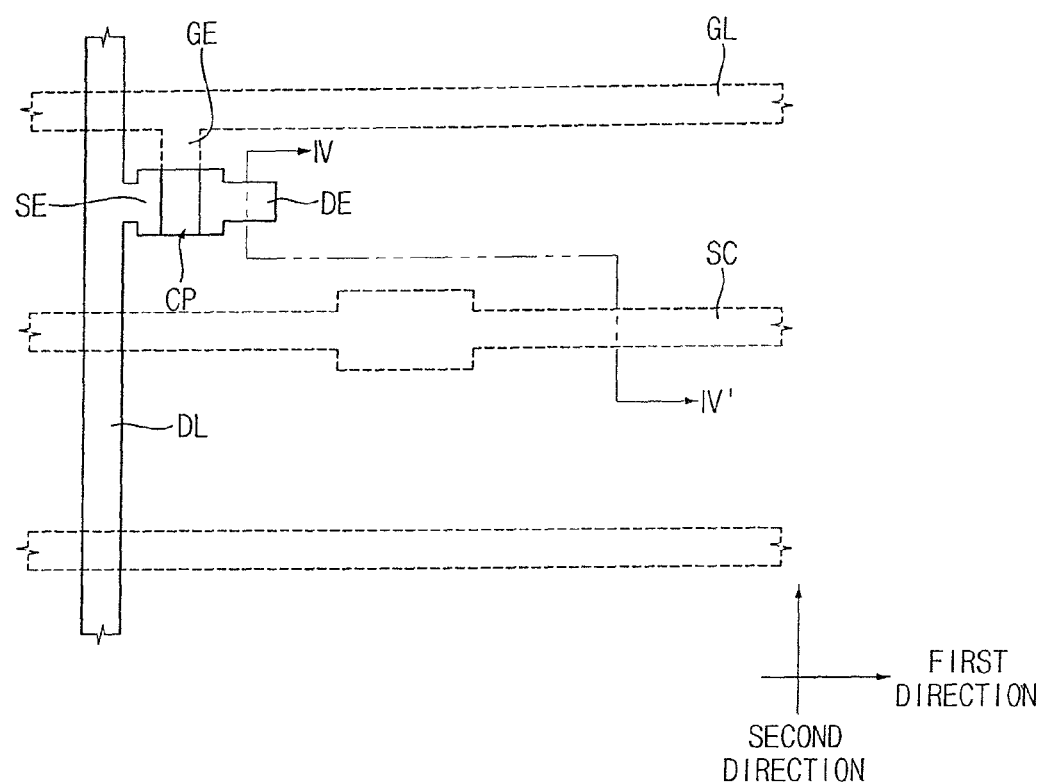
FIG. 23 is a plan view showing an output terminal on a substrate in accordance with an exemplary embodiment of the present invention.
Figure 24:
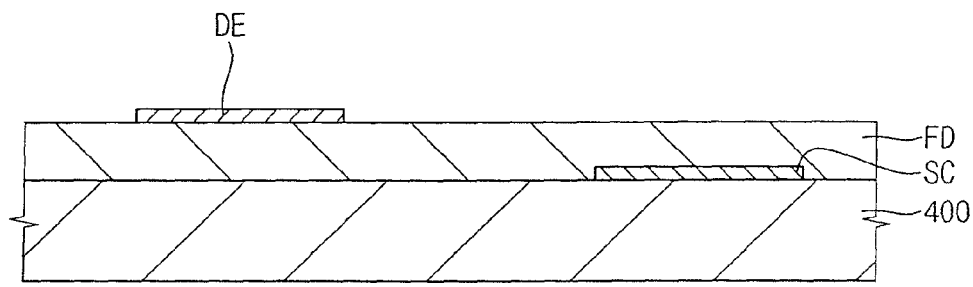
FIG. 24 is a cross-sectional view taken along a line IV-IV' shown in FIG. 23.

FIG. 23 is a plan view showing an output terminal on a substrate in accordance with an exemplary embodiment of the present invention. FIG. 24 is a cross-sectional view taken along a line IV-IV' shown in FIG. 23.

Referring to FIGS. 23 and 24, a first dielectric layer FD is formed on substantially the entire surface of the substrate 400 having the storage electrode patterns SC and the gate lines GL. The first dielectric layer FD may be formed through e.g. a spin coating process, or a slit coating process.

A data line DL, an output terminal DE and a channel pattern CP may be formed on the first dielectric layer FD. Alternatively, a plurality of data lines, a plurality of output terminals and a plurality of channel patterns may be formed on the first dielectric layer.

In particular, a channel layer having an amorphous silicon layer and an impurity doped silicon layer that is on the amorphous silicon layer is formed on the first dielectric layer FD.

A source/drain metal layer is formed on the impurity doped amorphous silicon layer. The source/drain metal layer includes a first molybdenum thin film, an aluminum thin film that is on the first molybdenum thin film and a second molybdenum thin film that is on the aluminum thin film.

A photoresist film is formed on the source/drain metal layer. The photoresist film is patterned through a photo process to form a photoresist pattern on the source/drain metal layer. The source/drain metal layer is partially etched using the photoresist pattern as an etching mask to form the data lines DL and the output terminals DE.

When the resolution of the display device is about 1024× 768, the number of the data lines DL is about 1024×3. The data lines DL are formed to extend in a second direction that is substantially perpendicular to the first direction. The source electrodes SE are electrically connected to the data lines DL. The source electrodes SE are formed to extend in the first direction. A portion of each of the source electrodes SE corresponds to the gate electrode GE. Each of the output terminals DE is spaced apart from each of the source electrodes SE.

The channel layer is partially etched to form the channel pattern CP using the photoresist pattern as an etching mask, the data lines DL and the output terminals DE. A portion of the impurity doped silicon layer between each of the source electrodes SE and each of the output terminals DE is removed so that each of the source electrodes SE is electrically insulated from each of the output terminals DE.

Figure 25:
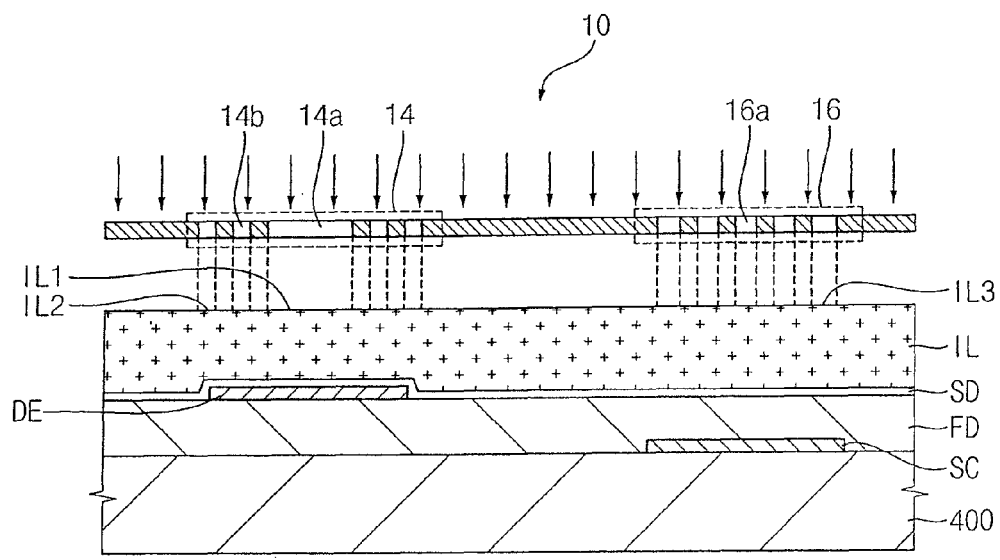
FIG. 25 is a cross-sectional view showing a second dielectric layer and an insulating layer covering the output terminal shown in FIG. 24.

FIG. 25 is a cross-sectional view showing a second dielectric layer and an insulating layer covering the output terminal shown in FIG. 24.

Referring to FIG. 25, a second dielectric layer SD is formed on the first dielectric layer FD. The second dielectric layer SD includes silicon nitride, and covers the output terminals DE that are on the first dielectric layer FD. An insulating layer IL is on the second dielectric layer SD. The insulating layer IL includes a photoresist material.

A mask 10 having a first exposing part 14 and a second exposing part 16 is aligned on the substrate 400 having the insulating layer IL.

The first exposing part 14 corresponds to the output terminals DE that are under the insulating layer IL. The second exposing part 16 corresponds to the storage electrode patterns SC that are under the first dielectric layer FD.

The insulating layer IL including the photoresist material is exposed through the mask 10 having the first and second exposing parts 14 and 16.

The first portion $IL_1$ of the insulating layer IL corresponding to a first light transmitting portion 14a of the first exposing part 14 is exposed to a light of a first light amount. A second portion $IL_2$ of the insulating layer IL corresponding to a second light transmitting portion 14b of the first exposing part 14 is exposed to a light of a second light amount. The second light amount may be about half of the first light amount. A third portion $IL_3$ of the insulating layer IL corresponding to a third light transmitting portion 16a of the second exposing part 16 is exposed to a light of a third light amount. The third light amount is smaller than the first light amount, but greater than the second light amount.

Figure 26:
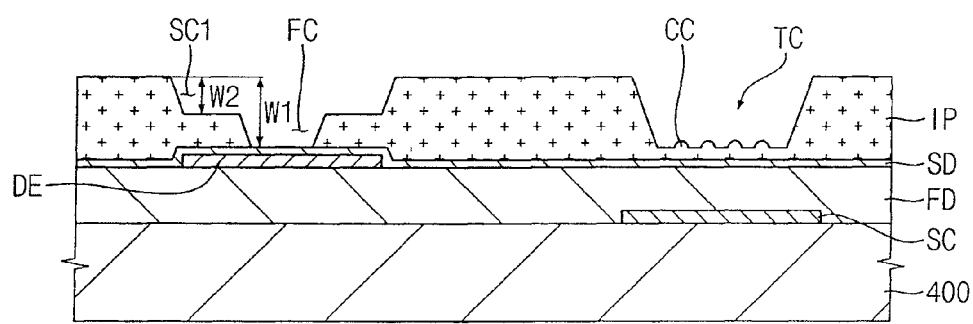
FIG. 26 is a cross-sectional view showing an insulating pattern formed by patterning the insulating layer shown in FIG. 24.

FIG. 26 is a cross-sectional view showing an insulating pattern formed by patterning the insulating layer shown in FIG. 24.

Referring to FIG. 26, the insulating layer IL that is on the second dielectric layer SD is patterned through a photo process to form an insulating pattern IP on the second dielectric layer SD. In particular, the first portion $IL_1$ of the insulating layer IL is fully exposed to the light of the first light amount to form a first opening FC on the insulating layer IL. The second portion $IL_2$ of the insulating layer IL is partially exposed to the light of the second light amount to form a second opening SC on the insulating layer IL. The third portion $IL_3$ of the insulating layer IL is partially exposed to the light of the third light amount to form a third opening TC on the insulating layer IL.

The second opening SC has a greater area than the first opening FC when viewed on a plane. A depth W1 of the first opening FC is substantially the same as a thickness of the insulating layer IL. A depth W2 of the second opening SC is about half of the thickness of the insulating layer IL.

A thickness T of a remaining portion remaining in the third opening TC is substantially the same as the thickness of the second dielectric layer SD. The remaining portion blocks the second dielectric layer SD corresponding to the storage electrode patterns SC so that the second dielectric layer SD corresponding to the storage electrode patterns SC may not etched.

An embossed pattern CC is formed on an upper surface of the remaining portion corresponding to the third opening TC. For example, the embossed pattern CC may include a protruded shape, a stripe shape, or a mesh shape.

Alternatively, a fourth opening FC that has a substantially the same shape as the second opening SC may be formed adjacent to the third opening TC.

Figure 27:
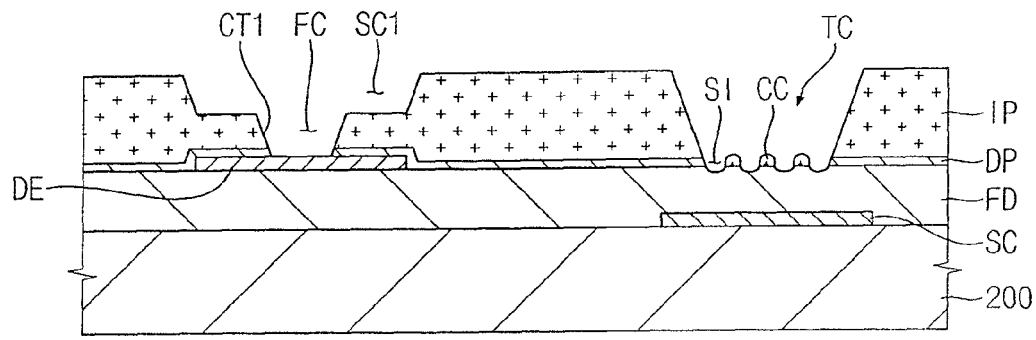
FIG. 27 is a cross-sectional view showing a dielectric pattern formed by patterning the second dielectric layer shown in FIG. 26.

FIG. 27 is a cross-sectional view showing a dielectric pattern formed by patterning the second dielectric layer shown in FIG. 26.

Referring to FIG. 27, the insulating pattern IP and the second dielectric layer SD are etched to form a dielectric pattern DP on the first dielectric layer FD. The insulating pattern IP and the second dielectric layer SD may be etched e.g., through a dry etching process or a wet etching process. A portion of the second dielectric layer SD exposed through the first opening FC corresponding to the output terminal DE is partially removed to form a first contact hole $CT_1$ in the second dielectric layer SD.

The remaining portion on the second dielectric layer SD corresponding to each of the storage electrode patterns SC and a portion of the storage electrode patterns SC are etched to form a surface increasing part SI on the second dielectric layer SD corresponding to each of the storage electrode patterns SC.

For example, the surface increasing part SI may include a plurality of protrusions that protrude from a surface of the second dielectric layer SD. Alternatively, the surface increasing part SI may include a plurality of recesses that are recessed from the surface of the second dielectric layer SD. The surface increasing part SI may include a plurality of convexes and concaves. The surface increasing part SI may also include a plurality of ridges and grooves.

A second contact hole $CT_2$ is formed in the insulating pattern IP corresponding to the surface increasing part SI.

For example, a stepped portion is not formed in the second contact hole $CT_2$. Alternatively, the stepped portion that has substantially the same cross-section as the first contact hole $CT_1$ may be formed in the second contact hole $CT_2$.

The embossed pattern CC for forming the surface increasing part SI may be removed using an ashing process.

Figure 28:
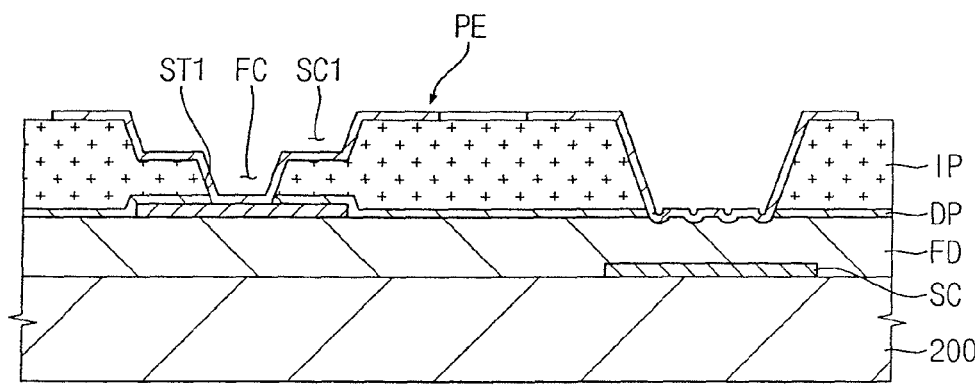
FIG. 28 is a cross-sectional view showing a pixel electrode on the insulating pattern shown in FIG. 27.

FIG. 28 is a cross-sectional view showing a pixel electrode on the insulating pattern shown in FIG. 27.

Referring to FIG. 28, a transparent conductive layer is formed on a substantially the entire surface of the insulating pattern IP.

A photoresist film is formed on the transparent conductive layer. The photoresist film on the transparent conductive layer is patterned to form a photoresist pattern. The transparent conductive layer is etched using the photoresist pattern as an etching mask through e.g., a dry etching process or a wet etching process to form a pixel electrode PE. Alternatively, a plurality of pixel electrodes may be formed on the insulating pattern IP. Each of the pixel electrodes PE is electrically connected to each of the output terminals DE through the first contact hole $CT_1$. A portion of each of the pixel electrodes PE is on the first dielectric layer FD corresponding to each of the storage electrode patterns SC through the second contact hole $CT_2$. The portion of each of the pixel electrodes PE, each of the storage electrode patterns SC, the first dielectric layer FD and the dielectric pattern DP form another storage capacitor.

Figure 29:
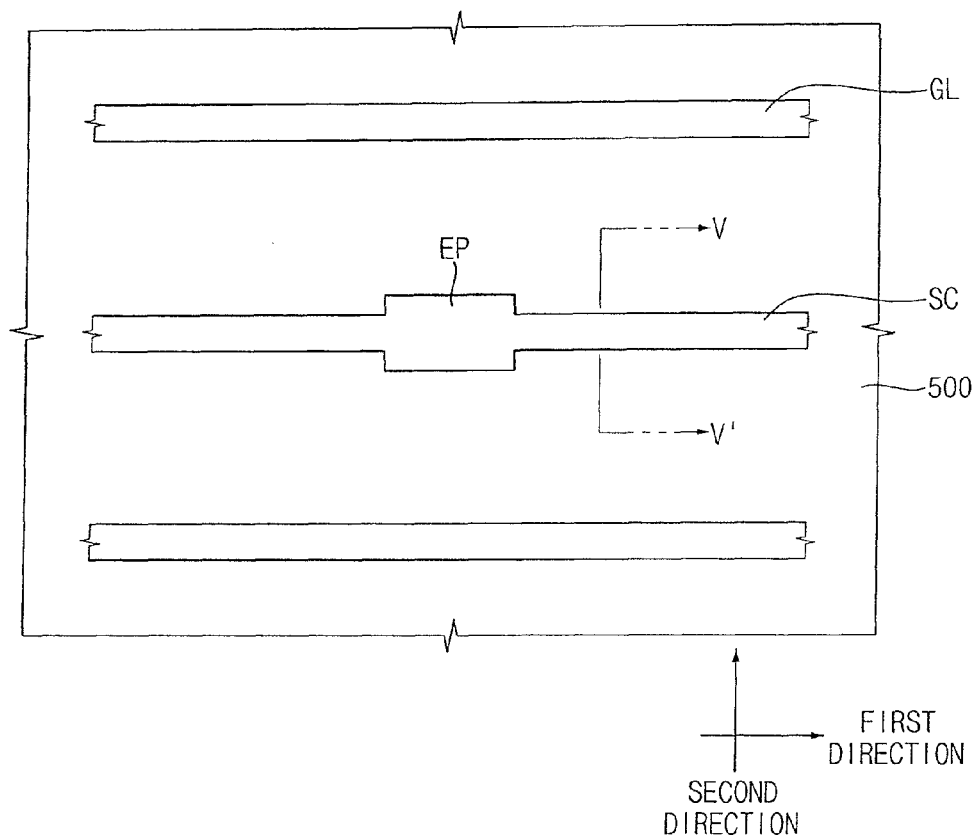
FIG. 29 is a plan view showing a storage electrode pattern on a substrate in accordance with an exemplary embodiment of the present invention.
Figure 30:
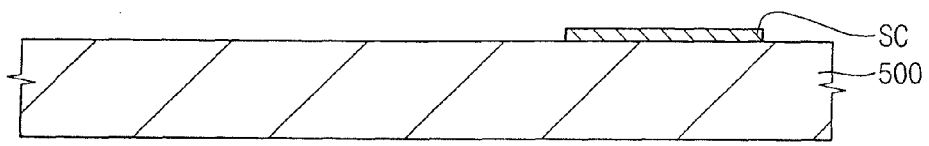
FIG. 30 is a plan view taken along a line V-V' shown in FIG. 29.

FIG. 29 is a plan view showing a storage electrode pattern on a substrate in accordance with an exemplary embodiment of the present invention. FIG. 30 is a plan view taken along a line V-V' shown in FIG. 29.

Referring to FIGS. 29 and 30, a metal layer is formed on a substantially the entire surface of a substrate 500. The substrate 500 includes a transparent material. Examples of the transparent material that can be used for the substrate 500 include but are not limited to glass or quartz. Examples of a metal that can be used for the metal layer include but are not limited to molybdenum, and/or aluminum. For example, in this exemplary embodiment, the metal layer has a double layered structure including a molybdenum layer on the substrate 500 and an aluminum layer on the molybdenum layer. A photoresist pattern is formed on the metal layer through a photo process, and the metal layer is partially etched using the photoresist pattern as an etching mask.

In addition, a storage electrode pattern SC is formed on the substrate 500. A gate line GL and a gate electrode GE may be formed from substantially the same layer as the storage electrode pattern SC. Alternatively, a plurality of gate lines, a plurality of gate electrodes and a plurality of storage electrode patterns may be formed.

When the resolution of the display device is about 1024× 768, the number of the gate lines GL that extend in a first direction is about 768. The storage electrode patterns SC that extend in the first direction may be between adjacent gate lines GL. Each of the storage electrode patterns SC may further include an expanding portion EP that has a greater width than a remaining portion of each of the storage electrode patterns SC to increase the capacitance of the storage capacitor.

Figure 31:
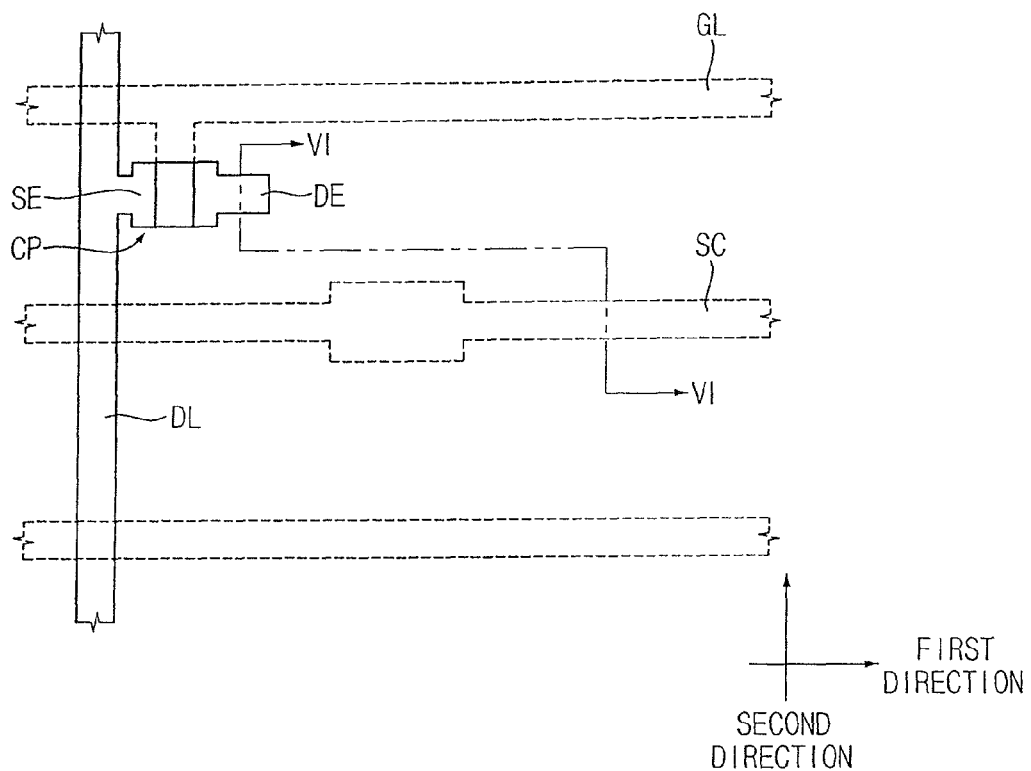
FIG. 31 is a plan view showing an output terminal on a substrate in accordance with an exemplary embodiment of the present invention.
Figure 32:
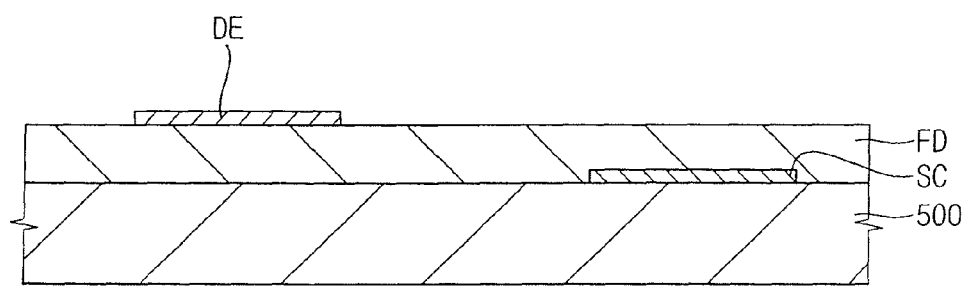
FIG. 32 is a cross-sectional view taken along a line VI-VI' shown in FIG. 31.

FIG. 31 is a plan view showing an output terminal on a substrate in accordance with an exemplary embodiment of the present invention. FIG. 32 is a cross-sectional view taken along a line VI-VI' shown in FIG. 31.

Referring to FIGS. 31 and 32, a first dielectric layer FD is formed on substantially the entire surface of the substrate 500 having the storage electrode patterns SC and the gate lines GL. The first dielectric layer FD may be formed e.g., through a spin coating process or a slit coating process.

A data line DL, an output terminal DE and a channel pattern CP may be formed on the first dielectric layer FD. Alternatively, a plurality of data lines, a plurality of output terminals and a plurality of channel patterns may be formed on the first dielectric layer.

For example, in this exemplary embodiment, a channel layer having an amorphous silicon layer and an impurity doped silicon layer that is on the amorphous silicon layer is formed on the first dielectric layer FD.

A source/drain metal layer is formed on the impurity doped amorphous silicon layer. The source/drain metal layer includes a first molybdenum thin film, an aluminum thin film that is on the first molybdenum thin film and a second molybdenum thin film that is on the aluminum thin film.

A photoresist film is formed on the source/drain metal layer. The photoresist film is patterned through a photo process to form a photoresist pattern on the source/drain metal layer, and the source/drain metal layer is partially etched using the photoresist pattern as an etching mask to form the data lines DL and the output terminals DE.

When the resolution of the display device is about 1024× 768, the number of the data lines DL is about 1024×3. The data lines DL extend in a second direction that is substantially perpendicular to the first direction. The source electrodes SE are electrically connected to the data lines DL. The source electrodes SE extend in the first direction. A portion of each of the source electrodes SE corresponds to the gate electrode GE. Each of the output terminals DE is spaced apart from each of the source electrodes SE.

The channel layer is partially etched to form the channel pattern CP using the photoresist pattern as an etching mask, the data lines DL and the output terminals DE. A portion of the impurity doped silicon layer between each of the source electrodes SE and each of the output terminals DE is removed so that each of the source electrodes SE is electrically insulated from each of the output terminals DE.

Figure 33:
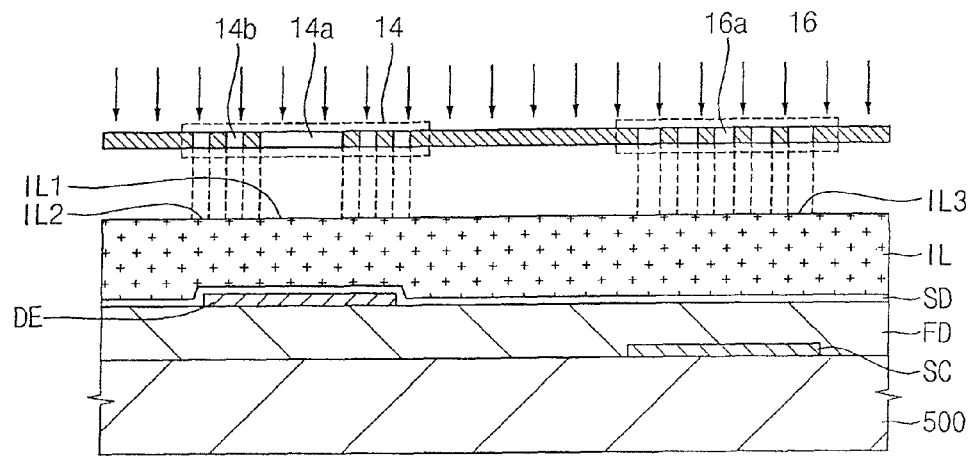
FIG. 33 is a cross-sectional view showing a second dielectric layer and an insulating layer covering the output terminal shown in FIG. 32.

FIG. 33 is a cross-sectional view showing a second dielectric layer and an insulating layer covering the output terminal shown in FIG. 32.

Referring to FIG. 33, a second dielectric layer SD is formed on the first dielectric layer FD. The second dielectric layer SD includes silicon nitride, and covers the output terminals DE that are on the first dielectric layer FD. An insulating layer IL is on the second dielectric layer SD. The insulating layer IL includes a photoresist material.

A mask 10 having a first exposing part 14 and a second exposing part 16 is aligned on the substrate 500 having the insulating layer IL.

The first exposing part 14 corresponds to the output terminals DE that are under the insulating layer IL. The second exposing part 16 corresponds to the storage electrode patterns SC that are under the first dielectric layer FD.

The insulating layer IL including the photoresist material is exposed through the mask 10 having the first and second exposing parts 14 and 16. The first portion $IL_1$ of the insulating layer IL corresponding to a first light transmitting portion 14a of the first exposing part 14 is exposed to a light of a first light amount. A second portion $IL_2$ of the insulating layer IL corresponding to a second light transmitting portion 14b of the first exposing part 14 is exposed to a light of a second light amount. The second light amount may be about half of the first light amount. A third portion $IL_3$ of the insulating layer IL corresponding to a third light transmitting portion 16a of the second exposing part 16 is exposed to a light of a third light amount. The third light amount is smaller than the first light amount, but greater than the second light amount.

Figure 34:
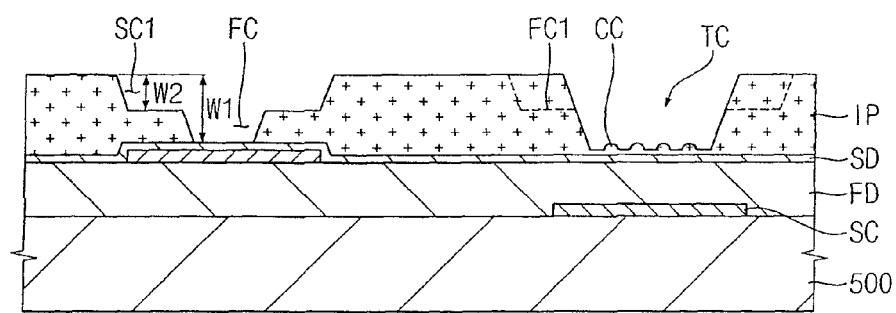
FIG. 34 is a cross-sectional view showing an insulating pattern formed by patterning the insulating layer shown in FIG. 33.

FIG. 34 is a cross-sectional view showing an insulating pattern formed by patterning the insulating layer shown in FIG. 33.

Referring to FIG. 34, the insulating layer IL that is on the second dielectric layer SD is patterned through a photo process to form an insulating pattern IP on the second dielectric layer SD. In particular, the first portion $IL_1$ of the insulating layer IL is fully exposed to the light of the first light amount to form a first opening FC on the insulating layer IL. The second portion $IL_2$ of the insulating layer IL is partially exposed to the light of the second light amount to form a second opening SC on the insulating layer IL. The third portion $IL_3$ of the insulating layer IL is partially exposed to the light of the third light amount to form a third opening TC on the insulating layer IL.

The second opening SC has a greater area than the first opening FC when viewed on a plane. A depth W1 of the first opening FC is substantially the same as the thickness of the insulating layer IL. A depth W2 of the second opening SC is about half of the thickness of the insulating layer IL.

A thickness T of a remaining portion remaining in the third opening TC is substantially the same as the thickness of the second dielectric layer SD. The remaining portion blocks the second dielectric layer SD corresponding to the storage electrode patterns SC so that the second dielectric layer SD corresponding to the storage electrode patterns SC may not be etched.

An embossed pattern CC is formed on an upper surface of the remaining portion corresponding to the third opening TC. For example, the embossed pattern CC may include a protruded shape, a stripe shape, or a mesh shape.

Alternatively, a fourth opening FC that has substantially the same shape as the second opening SC may be formed adjacent to the third opening TC.

Figure 35:
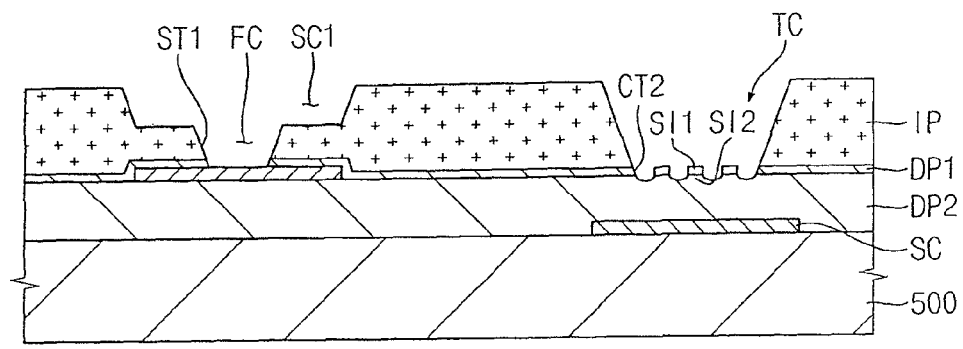
FIG. 35 is a cross-sectional view showing a dielectric pattern formed by patterning the second dielectric layer showing in FIG. 34.

FIG. 35 is a cross-sectional view showing a dielectric pattern formed by patterning the second dielectric layer showing in FIG. 34.

Referring to FIG. 35, the insulating pattern IP and the second dielectric layer SD are etched to form a first dielectric pattern DP1. The insulating pattern IP and the second dielectric layer SD may be etched e.g., through a dry etching process or a wet etching process. A portion of the second dielectric layer SD exposed through the first opening FC corresponding to the output terminal DE is partially removed to form a first contact hole $CT_1$.

The remaining portion on the second dielectric layer SD corresponding to each of the storage electrode patterns SC and a portion of the storage electrode patterns SC are etched to form a first surface increasing part SI1 on the second dielectric layer SD corresponding to each of the storage electrode patterns SC.

For example, the first surface increasing part SI1 may include a plurality of protrusions that protrude from a surface of the second dielectric layer SD. Alternatively, the first surface increasing part SI1 may include a plurality of recesses that are recessed from the surface of the second dielectric layer SD. The first surface increasing part SI1 may include a plurality of convexes and concaves. The first surface increasing part SI1 may also include a plurality of ridges and grooves.

A second contact hole $CT_2$ is formed in the insulating pattern IP corresponding to the first surface increasing part SI1.

In addition, the first dielectric layer FD is patterned using the first surface increasing part SI1 as a mask to form a second surface increasing part SI2 under the first surface increasing part SI1.

For example, a stepped portion is not formed in the second contact hole $CT_2$. Alternatively, the stepped portion that has substantially the same cross-section as the first contact hole $CT_1$ may be formed in the second contact hole $CT_2$.

The embossed pattern CC for forming the first and second surface increasing parts SI1 and SI2 may be removed using an ashing process.

Figure 36:
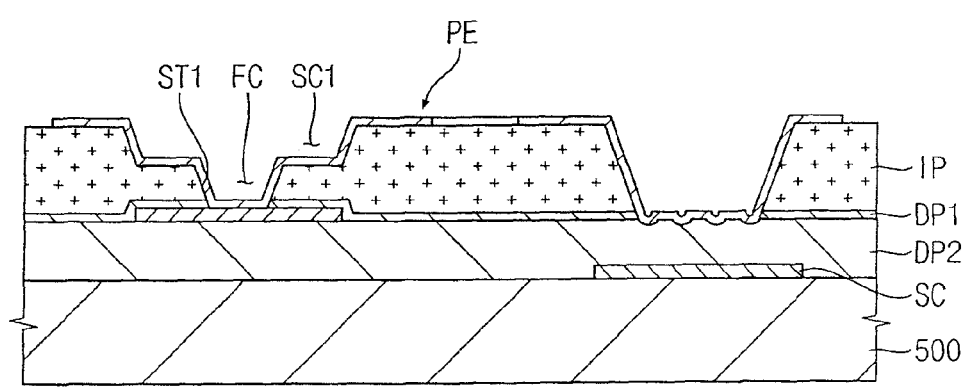
FIG. 36 is a cross-sectional view showing a pixel electrode on the insulating pattern shown in FIG. 34.

FIG. 36 is a cross-sectional view showing a pixel electrode on the insulating pattern shown in FIG. 34.

Referring to FIG. 36, a transparent conductive layer is formed on substantially the entire surface of the insulating pattern IP.

A photoresist film is formed on the transparent conductive layer. The photoresist film on the transparent conductive layer is patterned to form a photoresist pattern.

The transparent conductive layer is etched using the photoresist pattern as an etching mask e.g, through a dry etching process or a wet etching process to form a pixel electrode PE. Each of the pixel electrodes PE is electrically connected to each of the output terminals DE through the first contact hole $CT_1$. A portion of each of the pixel electrodes PE is on the first dielectric layer FD corresponding to each of the storage electrode patterns SC through the second contact hole $CT_2$. The portion of each of the pixel electrodes PE, each of the storage electrode patterns SC, the first and second dielectric patterns DP1 and DP2 form another storage capacitor.

Figure 37:
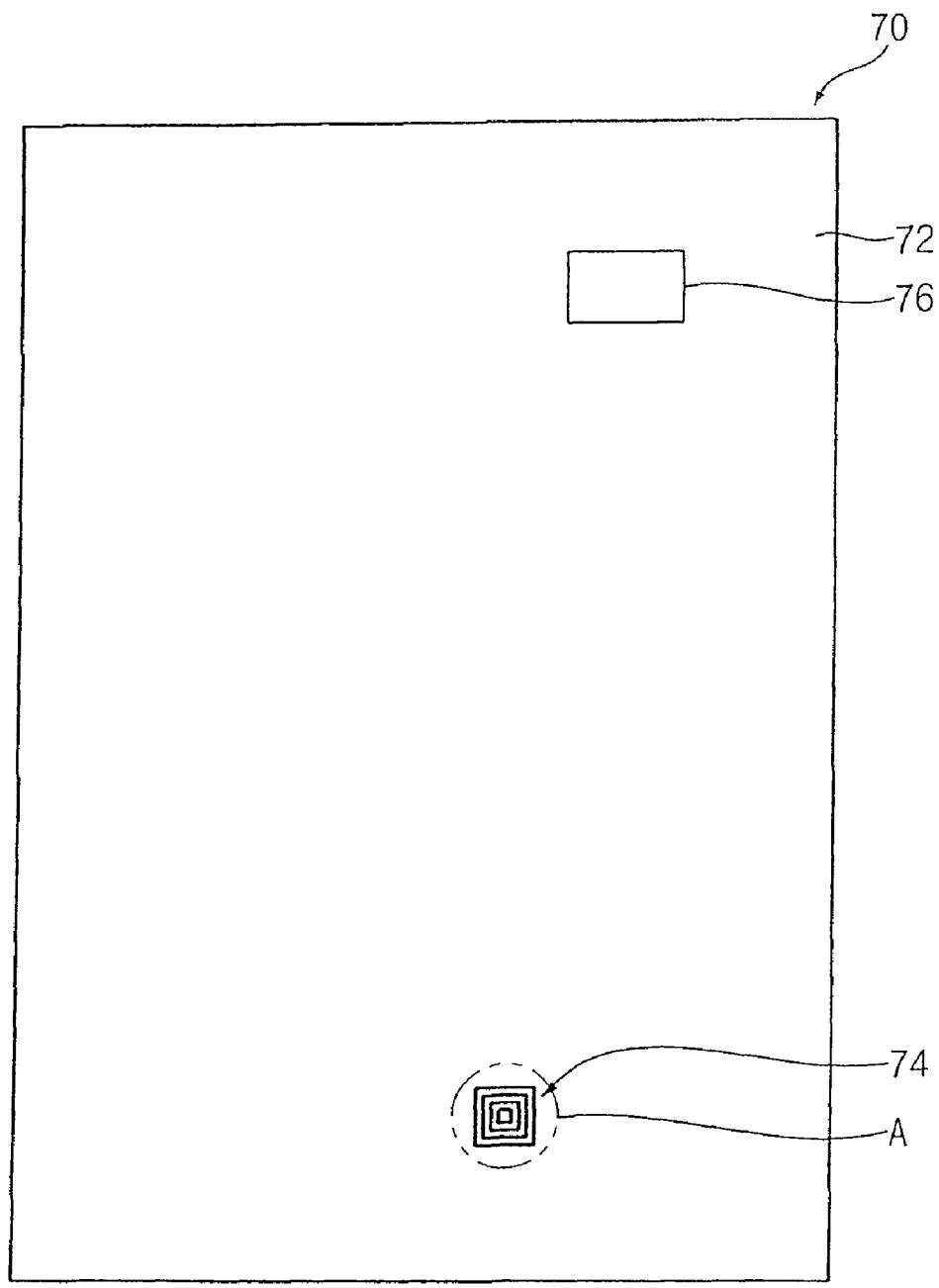
FIG. 37 is a plan view showing a mask in accordance with an exemplary embodiment of the present invention.
Figure 38:
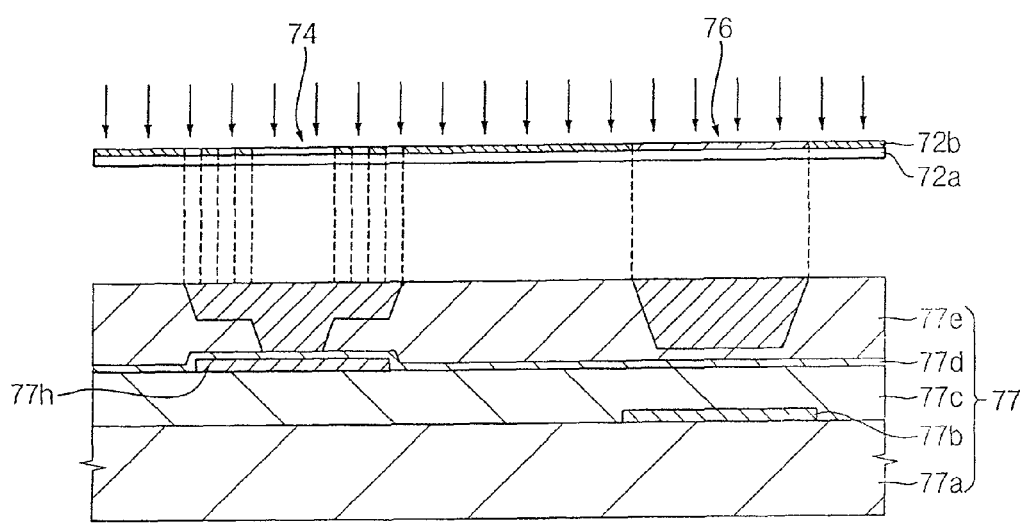
FIG. 38 is a cross-sectional view showing the mask shown in FIG. 37.

FIG. 37 is a plan view showing a mask in accordance with an exemplary embodiment of the present invention. FIG. 38 is a cross-sectional view showing the mask shown in FIG. 37.

The mask may be used e.g., for manufacturing a display substrate having a photoresist film that covers an output terminal of a signal output unit such as a thin film transistor (TFT) and a storage electrode of a storage capacitor that maintains a voltage difference between electrodes during one frame.

Referring to FIGS. 37 and 38, the mask 70 for manufacturing the display device includes a mask body 72, a slit exposing part 74 and a translucent part 76. A light source is on a front side of the mask 70. The light source generates light of a first light amount.

The mask body 72 includes a transparent substrate 72a and a light blocking layer 72b on the transparent substrate 72a. The light blocking layer 72b is patterned to form the slit exposing part 74 and the translucent part 76. The light generated from the light source is irradiated onto the display through the slit exposing part 74 and the translucent part 76 of the mask 70.

Figure 39:
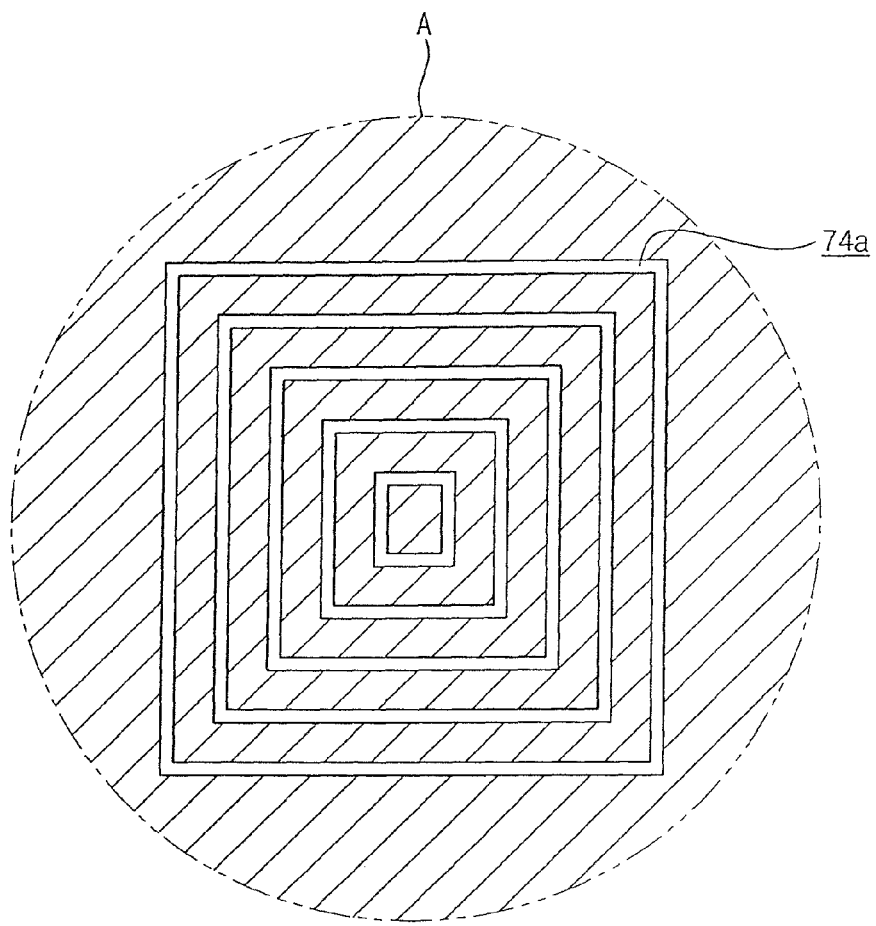
FIG. 39 is an enlarged plan view showing a portion 'D' shown in FIG. 37.

FIG. 39 is an enlarged plan view showing a portion 'D' shown in FIG. 37.

Referring to FIG. 39, the slit exposing part 74 includes a plurality of slits 74a.

For example, the light blocking layer 72b is patterned to form the slits 74a. The width of each of the slits 74a may be about 1.2 μm to about 1.4 μm. As illustrated in FIG. 39, the width of each of the slits 74a is about 1.3 μm.

Each of the slits 74a may have a substantially quadrangular loop shape. Alternatively, each of the slits 74a may have a stripe shape.

A portion of the light having passed through the slits 74a is diffracted so that the portion of the light having passed through the slits 74a becomes light of a second light amount that is smaller than the first light amount. The insulating layer 60 corresponding to the slits 74a is partially exposed using the portion of the light of the second light amount.

Referring again to FIG. 38, an insulating layer and an organic layer corresponding to an output terminal 77h of a display substrate 77 is patterned using the slit exposing part 74 of the mask 70 to form an insulating pattern 77e and a second organic pattern 77d on the display substrate 77.

The translucent part 76 is aligned on the insulating layer corresponding to the storage electrode 77b. A portion of the insulating layer remains on a second organic layer that is on a first organic layer 77c. The first organic layer 77c covers the storage electrode 77b. For example, the thickness of the remaining portion of the insulating layer is substantially the same as that of the second organic layer.

The translucent part 76 transmits a portion of the light generated from the light source. For example, when a wavelength of the light generated from the light source is about 436 nm to about 193 nm, the light of about 20% to about 70% passes through the translucent part 76 to be irradiated onto the insulating layer. Moreover, to control the amount of the light passing through the translucent part 76, the translucent part 76 may include e.g., a chromium oxide thin film or a chromium nitride thin film. A thickness of the translucent part 76 is adjusted based on the light transmittance of the translucent part 76.

The light having passed through the translucent part 76 has higher luminance uniformity than the light having passed through the slit exposing part 74. That is, when the mask 70 includes the translucent part 76, the luminance uniformity of the mask 70 is improved.

In FIG. 39, the insulating layer is uniformly patterned to have a uniform thickness. When the insulating layer has the uniform thickness, the insulating layer may be completely removed so that the insulating layer does not remain on the second organic pattern 77d.

The light having passed through the slit exposing part 74 has a first light amount. The light having passed through the translucent part 76 has a second light amount that is smaller than the first light amount. The insulating layer corresponding to the slit exposing part 74 is fully exposed to the light of the first light amount. The insulating layer corresponding to the translucent part 76 is partially exposed. For example, the thickness of the insulating layer exposed to the light of the second light amount is substantially the same as that of the second organic pattern 77d.

Figure 40:
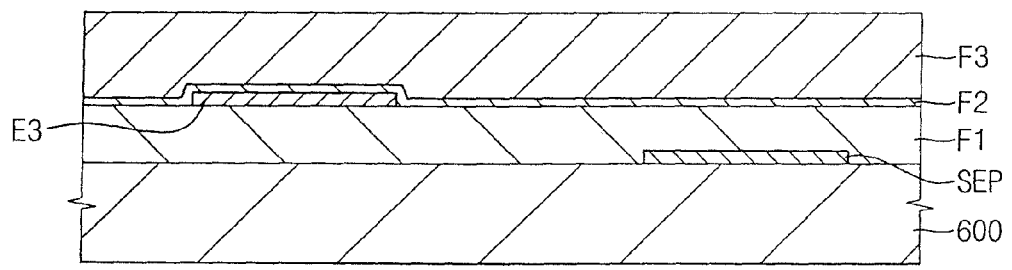
FIG. 40 is a cross-sectional view showing a storage electrode pattern, a first dielectric layer, an output terminal, a second dielectric layer and an insulating layer on a substrate in accordance with an exemplary embodiment of the present invention.
Figure 41:
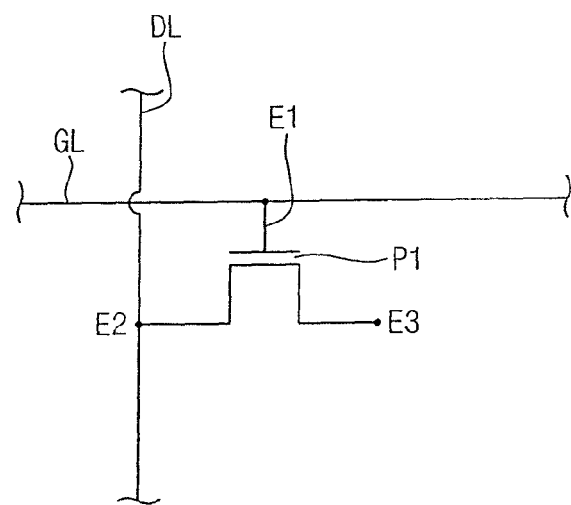
FIG. 41 is a plan view showing the storage electrode pattern, the first dielectric layer, the output terminal, the second dielectric layer and the insulating layer on the substrate shown in FIG. 40.

FIG. 40 is a cross-sectional view showing a storage electrode pattern, a first dielectric layer, an output terminal, a second dielectric layer and an insulating layer on a substrate in accordance with an exemplary embodiment of the present invention. FIG. 41 is a plan view showing the storage electrode pattern, the first dielectric layer, the output terminal, the second dielectric layer and the insulating layer on the substrate shown in FIG. 40.

Referring to FIGS. 40 and 41, a metal layer is formed on substantially the entire surface of a substrate 600. The substrate 600 includes a transparent material. Examples of the transparent material that can be used for the substrate 600 include but are not limited to glass or quartz. Examples of a metal that can be used for the metal layer include but are not limited to molybdenum, and/or aluminum. For example, in this exemplary embodiment, the metal layer has a double layered structure including a molybdenum layer on the substrate 600 and an aluminum layer on the molybdenum layer. A photoresist pattern is formed on the metal layer through a photo process. The metal layer is partially etched using the photoresist pattern as an etching mask.

In addition, a storage electrode pattern SEP is formed on the substrate 600. A gate line GL and a gate electrode E1 may be formed from substantially the same layer as the storage electrode pattern SEP. Alternatively, a plurality of gate lines, a plurality of gate electrodes and a plurality of storage electrode patterns may be formed. When the resolution of the display device is about 1024×768, the number of the gate lines GL that extend in a first direction is about 768. The gate lines GL extend in a first direction with respect to the substrate 600. The storage electrode patterns SEP that extend in the first direction may be between adjacent gate lines GL. Each of the storage electrode patterns SC may further include an expanding portion that has a greater width than a remaining portion of each of the storage electrode patterns SEP to increase the capacitance of the storage capacitor.

Referring again to FIGS. 40 and 41, a first dielectric layer F1 is formed on substantially the entire surface of the substrate 600 having the storage electrode patterns SC and the gate lines GL. The first dielectric layer FD may be formed through e.g., a spin coating process, a slit coating process.

A data line DL, an output terminal E3 and a channel pattern P1 may be formed on the first dielectric layer F1. Alternatively, a plurality of data lines, a plurality of output terminals and a plurality of channel patterns may be formed on the first dielectric layer.

For instance, in this exemplary embodiment, a channel layer having an amorphous silicon layer and an impurity doped silicon layer that is on the amorphous silicon layer is formed on the first dielectric layer F1.

A source/drain metal layer is formed on the impurity doped amorphous silicon layer. The source/drain metal layer includes a first molybdenum thin film, an aluminum thin film that is on the first molybdenum thin film and a second molybdenum thin film that is on the aluminum thin film.

A photoresist film is formed on the source/drain metal layer. The photoresist film is patterned through a photo process to form a photoresist pattern on the source/drain metal layer, and the source/drain metal layer is partially etched using the photoresist pattern as an etching mask to form the data lines DL and the output terminals E3.

When the resolution of the display device is about 1024× 768, the number of the data lines DL may be about 1024×3. The data lines DL extend in a second direction that is substantially perpendicular to the first direction. The source electrodes E2 are electrically connected to the data lines DL. The source electrodes E2 extend in the first direction. A portion of each of the source electrodes E2 corresponds to the gate electrode GE. Each of the output terminals E3 is spaced apart from each of the source electrodes E2.

The channel layer is partially etched to form the channel pattern P1 using the photoresist pattern, the data lines DL and the output terminals E3. A portion of the impurity doped silicon layer between each of the source electrodes E2 and each of the output terminals E3 is removed so that each of the source electrodes E2 is electrically insulated from each of the output terminals E3.

A second dielectric layer F2 is formed on the first dielectric layer F1. The second dielectric layer F2 includes silicon nitride, and covers the output terminals E3 that are on the first dielectric layer F1. An insulating layer F3 is on the second dielectric layer F2. The insulating layer F3 includes a photoresist material.

Figure 42:
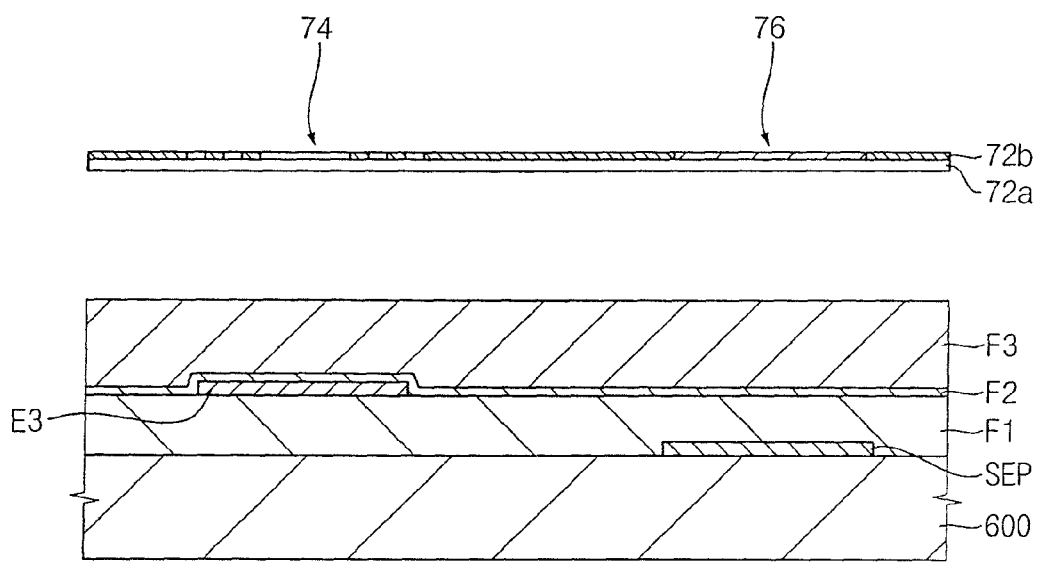
FIG. 42 is a cross-sectional view showing a mask aligned on the insulating layer shown in FIG. 41.

FIG. 42 is a cross-sectional view showing a mask aligned on the insulating layer shown in FIG. 41.

Referring to FIG. 42, the mask 70 for manufacturing the display device includes a slit exposing part 74 and a translucent part 76. The mask 70 is aligned on the substrate 600 having the insulating layer F3. A light source is on a front side of the mask 70. The light source generates light of a first light amount.

The slit exposing part 74 is aligned on the output terminals E3 that are under the insulating layer F3. The translucent part 76 is aligned on the storage electrode pattern SEP that is under the insulating layer F3.

Figure 43:
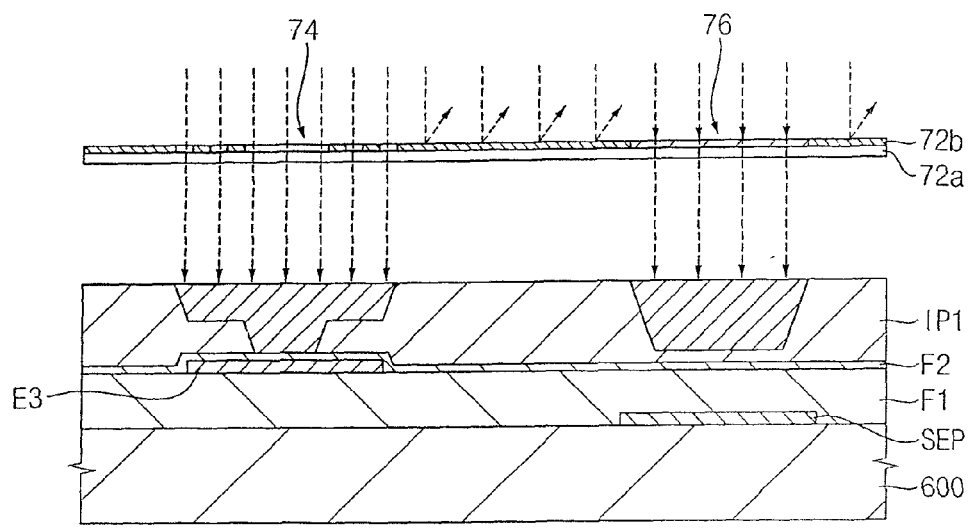
FIG. 43 is a cross-sectional view showing exposing the insulating layer through the mask shown in FIG. 42.

FIG. 43 is a cross-sectional view showing exposing the insulating layer through the mask shown in FIG. 42.

Referring to FIG. 43, the insulating layer F3 is exposed to a light that has passed through the mask 70 having the slit exposing part 74 and the translucent part 76.

A portion of the light having passed through the slit exposing part 74 is diffracted so that the portion of the light having passed through the slit exposing part 74 becomes light of a first light amount. The insulating layer 60 corresponding to the slit exposing part 74 is partially exposed using the portion of the light of the first light amount. A portion of the light having passed through the translucent part 76 becomes light of a third light amount that is smaller than the first light amount. The insulating layer 60 corresponding to the translucent part 76 is partially exposed using the portion of the light of the third light amount.

Figure 44:
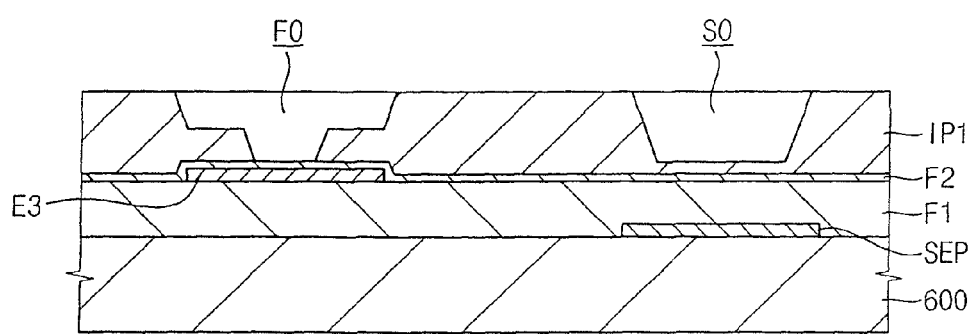
FIG. 44 is a cross-sectional view showing an insulating pattern formed by patterning the insulating layer shown in FIG. 43.

FIG. 44 is a cross-sectional view showing an insulating pattern formed by patterning the insulating layer shown in FIG. 43.

Referring to FIG. 44, the exposed portion of the insulating layer F3 is developed to form an insulating pattern IP1 on the second dielectric layer F2. The insulating pattern IP1 includes a first opening FO formed by the slit exposing part 74 and a second opening SO formed by the translucent part 75.

A thickness T of a remaining portion of the insulating pattern IP1 that remains in the second opening SO is substantially the same as that of the second dielectric layer F2. The remaining portion of the insulating pattern IP1 prevents the second dielectric layer F2 from being etched.

Figure 45:
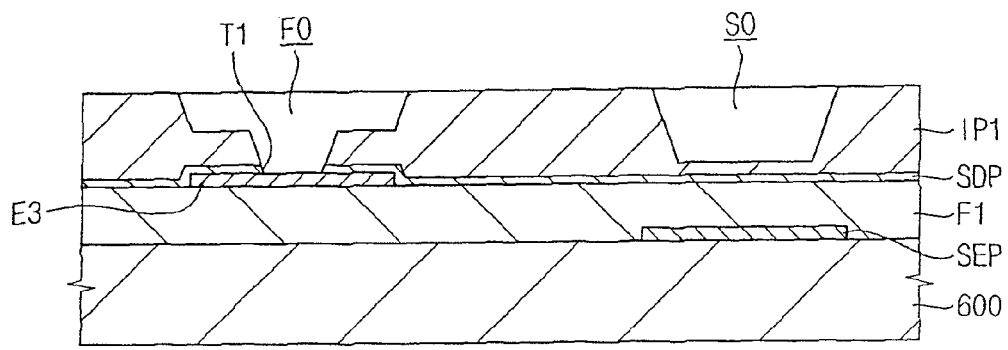
FIG. 45 is a cross-sectional view showing a dielectric pattern formed by patterning the second dielectric layer shown in FIG. 44.

FIG. 45 is a cross-sectional view showing a dielectric pattern formed by patterning the second dielectric layer shown in FIG. 44.

Referring to FIG. 45, the insulating pattern IP1 and the second dielectric layer F2 are partially etched to form a second dielectric pattern SDP through a dry etching process or a wet etching process. A portion of the second dielectric layer F2 exposed through the first opening FO corresponding to the output terminal E3 is partially removed to form a contact hole $T_1$ in the second dielectric pattern SDP.

When the second dielectric layer F2 is etched, the remaining portion of the insulating pattern IP1 is also etched so that a portion of the first dielectric layer F1 corresponding to the storage electrode patterns SEP is exposed.

Figure 46:
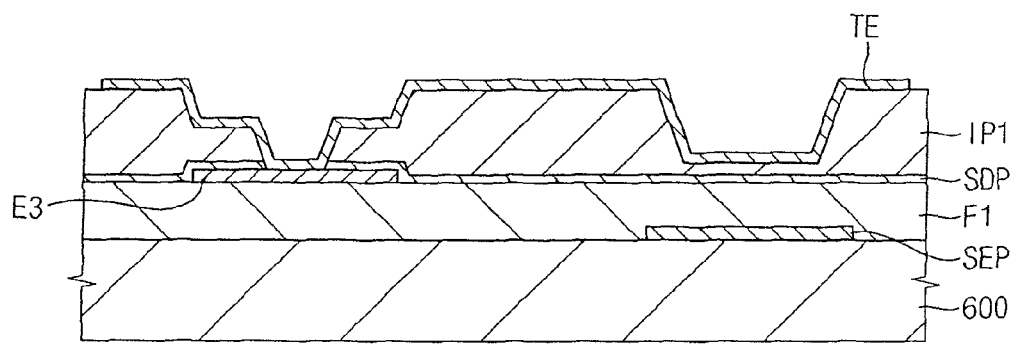
FIG. 46 is a cross-sectional view showing a pixel electrode on the insulating pattern shown in FIG. 45.

FIG. 46 is a cross-sectional view showing a pixel electrode on the insulating pattern shown in FIG. 45.

Referring to FIG. 46, a transparent conductive layer is formed on substantially the entire surface of the insulating pattern IP1.

A photoresist film is formed on the transparent conductive layer. The photoresist film on the transparent conductive layer is patterned to form a photoresist pattern.

The transparent conductive layer is etched using the photoresist pattern as an etching mask through e.g. a dry etching process or a wet etching process to form a pixel electrode TE. Alternatively, a plurality of pixel electrodes may be formed on the insulating pattern IP1. Each of the pixel electrodes TE is electrically connected to each of the output terminals E3 through the contact hole $T_1$. The portion of each of the pixel electrodes TE, each of the storage electrode patterns SEP, the first dielectric layer F1 and the second dielectric pattern SDP form another storage capacitor.

The electric characteristics of a storage capacitor formed by the storage electrode pattern and the pixel electrode of the exemplary embodiments are improved, resulting in a decrease of flicker and/or an afterimage of the display device and thereby also resulting the improvement of, the image display quality of the display device.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a display device comprising:
    forming a storage electrode pattern on a substrate;
    forming an output terminal to which an image signal is applied on a first dielectric layer that covers the storage electrode pattern;
    forming a second dielectric layer and an insulating layer on the first dielectric layer having the output terminal;
    patterning the insulating layer and the second dielectric layer so that a portion of the second dielectric layer corresponding to the output terminal is exposed, and a remaining portion of the insulating layer corresponding to the storage electrode pattern remains on a portion of the second dielectric layer corresponding to the storage electrode pattern;
    partially removing the exposed second dielectric layer and the remaining portion of the insulating layer to form a first contact hole through which the output terminal is partially exposed and a second contact hole in the second dielectric layer corresponding to the storage electrode pattern; and
    forming a pixel electrode on the insulating layer, the pixel electrode being electrically connected to the output terminal through the first contact hole, and corresponding to the storage electrode pattern in the second contact hole.

2. The method of claim 1, wherein the forming of the storage electrode pattern further comprises forming a plurality of gate lines adjacent to the storage electrode pattern.

3. The method of claim 2, after the forming of the first dielectric layer, further comprising: forming a channel layer on the first dielectric layer, the channel layer corresponding to a gate electrode that is electrically connected to the gate line; and forming an output terminal, the output terminal being electrically connected to the channel layer.

4. The method of claim 3, wherein the channel layer comprises an amorphous silicon pattern and an impurity doped amorphous silicon pattern on the amorphous silicon pattern.

5. The method of claim 1, wherein a portion of the insulating layer corresponding to the output terminal is exposed to a light of a first light amount and a portion of the insulating layer corresponding to the storage electrode pattern is exposed to a light of a second light amount.

6. The method of claim 1, wherein a thickness of the insulating layer corresponding to the storage electrode pattern is substantially the same as a thickness of the second dielectric layer.

7. The method of claim 1, wherein the remaining portion of the insulating layer corresponding to the storage electrode pattern is removed through an ashing process.

8. The method of claim 1, wherein the insulating layer corresponding to the output terminal has a first opening having a first width and a second opening having a second width that is smaller than the first width.

9. The method of claim 1, wherein the insulating layer has a first opening having a first width and a second opening having a second width that is smaller than the first width.

10. The method of claim 1, wherein the forming of the pixel electrode comprises: forming a transparent conductive layer on the insulating layer; and patterning the transparent conductive layer so that the pixel electrode is electrically connected to the output terminal and corresponds to the storage electrode pattern.

11. A method of manufacturing a display device comprising:
    foaming a storage electrode pattern between a substrate and a first dielectric layer on the substrate;
    forming an output terminal on the first dielectric layer;
    forming a second dielectric layer and an insulating layer on the first dielectric layer and the output terminal;
    patterning the insulating layer to form a first contact hole through which a portion of the second dielectric layer corresponding to the output terminal is partially exposed and a stepped pattern corresponding to the storage electrode pattern;
    patterning the second dielectric layer to form a second contact hole through which the output terminal is partially exposed and an embossed pattern corresponding to the stepped pattern; and
    forming a pixel electrode electrically connected to the output terminal, the pixel electrode comprising a storage electrode portion that covers the embossed pattern.

12. The method of claim 11, wherein the display device further comprises a gate line between the substrate and the first dielectric layer adjacent to the source electrode pattern.

13. The method of claim 11, wherein the display device further comprises:
    a data line on the first dielectric layer; and
    a channel layer electrically connected to the output terminal.

14. The method of claim 13, wherein the channel layer comprises an amorphous silicon pattern and an impurity doped amorphous silicon pattern on the amorphous silicon pattern.

15. The method of claim 11, wherein the patterning of the insulating layer further comprises aligning a mask on the insulating layer, and the mask has a plurality of slits corresponding to the stepped pattern.

16. The method of claim 11, wherein the second dielectric layer is patterned using the stepped pattern as an etching mask.

17. The method of claim 16, wherein the stepped pattern is removed from the second dielectric layer having the embossed pattern through an ashing process.

18. A method of manufacturing a display device comprising:
    forming a storage electrode pattern between a substrate and a first dielectric layer on the substrate and an output terminal on the first dielectric layer;
    forming a second dielectric layer and an insulating layer on the first dielectric layer and the output terminal;
    patterning the insulating layer to form a first contact hole through which a portion of the second dielectric layer corresponding to the output terminal is partially exposed and a plurality of insulating patterns corresponding to the storage electrode pattern, the insulating patterns having different heights;
    patterning the second dielectric layer to form a second contact hole through which the output terminal is partially exposed;
    patterning the second and first dielectric layers to form an embossed pattern corresponding to the insulating patterns; and
    forming a pixel electrode electrically connected to the output terminal, the pixel electrode comprising a storage electrode portion that covers the embossed pattern.

19. The method of claim 18, wherein the patterning of the insulating layer further comprises aligning a mask on the insulating layer, and the mask has a plurality of slits of various widths corresponding to the insulating patterns.

20. The method of claim 18, wherein the second and first dielectric layers are etched using the insulating patterns as an etching mask.

21. The method of claim 18, wherein the insulating patterns are removed from the second dielectric layer having the embossed pattern through an ashing process.

22. A method of manufacturing a display device comprising:
    forming a storage electrode pattern, a first dielectric layer covering the storage electrode pattern, an output terminal outputting a data signal, a second dielectric layer covering the output terminal and an insulating layer on the second dielectric layer on a substrate;
    aligning a mask including a slit exposing part having a plurality of slits and a translucent part corresponding to the storage electrode pattern on the insulating layer;
    patterning the insulating layer and the second dielectric layer using the slit exposing part and the translucent part so that a portion of the second dielectric layer corresponding to the output terminal is exposed, and a remaining portion of the insulating layer corresponding to the storage electrode pattern remains on a portion of the second dielectric layer corresponding to the storage electrode pattern;
    partially removing the exposed second dielectric layer and the remaining portion of the insulating layer to form a contact hole through which the output terminal is partially exposed and to expose a portion of the second dielectric layer corresponding to the storage electrode pattern; and
    forming a pixel electrode on the insulating layer, the pixel electrode being electrically connected to the output terminal through the contact hole, and corresponding to the storage electrode pattern in the second contact hole.

23. The method of claim 22, wherein a wavelength of a light that is irradiated onto the mask is about 436 nm to about 193 nm, and a light transmittance of the translucent part is about 20% to about 70%.

24. The method of claim 22, wherein the translucent part comprises a chromium oxide layer or a chromium nitride layer.

* * * * *